United States Patent
Moon et al.

(10) Patent No.: US 10,974,965 B2
(45) Date of Patent: Apr. 13, 2021

(54) SILICON-CONTAINING STRUCTURE, METHOD OF PREPARING THE SAME, CARBON COMPOSITE USING THE SAME, AND ELECTRODE, LITHIUM BATTERY, AND DEVICE EACH INCLUDING THE SAME

(71) Applicants: Samsung Electronics Co., Ltd., Suwon-si (KR); Samsung SDI Co., Ltd., Yongin-si (KR)

(72) Inventors: Jongseok Moon, Suwon-si (KR); Mijong Kim, Suwon-si (KR); Sewon Kim, Suwon-si (KR); Kyueun Shim, Suwon-si (KR); Sungsoo Han, Hwaseong-si (KR); Inhyuk Son, Yongin-si (KR); Jumyeung Lee, Suwon-si (KR); Minwoo Lim, Hwaseong-si (KR)

(73) Assignees: SAMSUNG ELECTRONICS CO., LTD., Gyeonggi-Do (KR); SAMSUNG SDI CO., LTD., Gyeonggi-Do (KR)

( * ) Notice: Subject to any disclaimer, the term of this patent is extended or adjusted under 35 U.S.C. 154(b) by 31 days.

(21) Appl. No.: 16/253,639

(22) Filed: Jan. 22, 2019

(65) Prior Publication Data
US 2019/0233294 A1    Aug. 1, 2019

(30) Foreign Application Priority Data
Jan. 26, 2018   (KR) .................. 10-2018-0009938
Dec. 28, 2018   (KR) .................. 10-2018-0173070

(51) Int. Cl.
   *B32B 9/00*     (2006.01)
   *C01B 33/023*   (2006.01)
   (Continued)

(52) U.S. Cl.
   CPC .......... *C01B 33/023* (2013.01); *C01B 32/186* (2017.08); *C01B 33/00* (2013.01);
   (Continued)

(58) Field of Classification Search
   None
   See application file for complete search history.

(56) References Cited

U.S. PATENT DOCUMENTS 6,911,767 B2   6/2005   Takai
6,976,897 B2   12/2005  Choi et al.
(Continued)

FOREIGN PATENT DOCUMENTS

CN   105789594 A      7/2016
KR   20130016727 A *  2/2013
(Continued)

OTHER PUBLICATIONS

European Office Action for European Patent Application No. 19153367.8 dated Feb. 27, 2020.
(Continued)

*Primary Examiner* — Seth Dumbris
*Assistant Examiner* — Kim S. Horger
(74) *Attorney, Agent, or Firm* — Cantor Colburn LLP

(57) ABSTRACT

A silicon-containing structure including: a silicon composite including a porous silicon secondary particle and a first carbon flake on a surface of the porous silicon secondary particle; a carbonaceous coating layer on the porous silicon composite, the carbonaceous coating layer comprising a first amorphous carbon; and the silicon composite comprises a second amorphous carbon and has a density that is equal to or less than a density of the carbonaceous coating layer, wherein the porous silicon secondary particle includes an aggregate of silicon composite primary particles, each including silicon, a silicon suboxide on a surface of the
(Continued)

silicon, and a second carbon flake on a surface of the silicon suboxide.

42 Claims, 14 Drawing Sheets

(51) Int. Cl.
    *H01M 4/38*      (2006.01)
    *H01M 4/48*      (2010.01)
    *H01M 4/1395*      (2010.01)
    *H01M 4/62*      (2006.01)
    *H01M 4/36*      (2006.01)
    *H01M 4/04*      (2006.01)
    *H01M 4/587*      (2010.01)
    *C01B 33/00*      (2006.01)
    *C01B 32/186*      (2017.01)
    *H01L 35/14*      (2006.01)
    *H01M 4/583*      (2010.01)
    *H01M 4/134*      (2010.01)
    *H01M 10/0525*      (2010.01)
    *C01B 32/182*      (2017.01)
    *C01B 32/20*      (2017.01)
    *B82Y 40/00*      (2011.01)
    *C01B 33/113*      (2006.01)

(52) U.S. Cl.
    CPC .......... *H01L 35/14* (2013.01); *H01M 4/0416* (2013.01); *H01M 4/0428* (2013.01); *H01M 4/1395* (2013.01); *H01M 4/366* (2013.01); *H01M 4/386* (2013.01); *H01M 4/48* (2013.01); *H01M 4/583* (2013.01); *H01M 4/587* (2013.01); *H01M 4/625* (2013.01); *B82Y 40/00* (2013.01); *C01B 32/182* (2017.08); *C01B 32/20* (2017.08); *C01B 33/113* (2013.01); *C01P 2004/03* (2013.01); *C01P 2004/04* (2013.01); *H01M 4/134* (2013.01); *H01M 10/0525* (2013.01)

(56) References Cited

U.S. PATENT DOCUMENTS

| | | | |
|---|---|---|---|
| 7,009,331 | B2 | 3/2006 | Sheu et al. |
| 10,079,389 | B2 | 9/2018 | Do et al. |
| 2006/0066217 | A1 | 3/2006 | Son |
| 2009/0239151 | A1 | 9/2009 | Nakanishi et al. |
| 2013/0040412 | A1 | 2/2013 | Park et al. |
| 2013/0209881 | A1* | 8/2013 | Do .................. H01M 4/134 429/213 |
| 2015/0093648 | A1 | 4/2015 | Son et al. |
| 2016/0013481 | A1 | 1/2016 | Jeong et al. |
| 2016/0359162 | A1 | 12/2016 | Kim et al. |
| 2017/0047584 | A1 | 2/2017 | Hwang et al. |
| 2017/0062804 | A1 | 3/2017 | Son et al. |
| 2018/0083272 | A1 | 3/2018 | Son et al. |
| 2018/0145316 | A1 | 5/2018 | Moon et al. |
| 2018/0190975 | A1 | 7/2018 | Ishii et al. |
| 2019/0207221 | A1 | 7/2019 | Son et al. |
| 2020/0136130 | A1 | 4/2020 | Choi et al. |

FOREIGN PATENT DOCUMENTS

| | | |
|---|---|---|
| KR | 1020130016727 A | 2/2013 |
| KR | 1020150015086 A | 2/2015 |
| KR | 1020150128592 A | 11/2015 |
| KR | 1020160002281 A | 1/2016 |
| KR | 1020160008041 A | 1/2016 |
| KR | 1020160085834 A | 7/2016 |
| KR | 1020160144573 A | 12/2016 |
| KR | 1020170066819 A | 6/2017 |
| KR | 1020190083613 A | 7/2019 |
| KR | 1020200047879 A | 5/2020 |
| WO | 2017002959 A1 | 1/2017 |

OTHER PUBLICATIONS

European Search Report for European Patent Application No. 19153367.8 dated Jun. 25, 2019.
EP European Search Report for European Patent Application No. 19153367.8 dated Aug. 10, 2020.

* cited by examiner

SILICON-CONTAINING STRUCTURE, METHOD OF PREPARING THE SAME, CARBON COMPOSITE USING THE SAME, AND ELECTRODE, LITHIUM BATTERY, AND DEVICE EACH INCLUDING THE SAME

CROSS-REFERENCE TO RELATED APPLICATION

This application claims priority to and the benefit of Korean Patent Application Nos. 10-2018-0009938, filed on Jan. 26, 2018, and 10-2018-0173070 filed on Dec. 28, 2018 in the Korean Intellectual Property Office, and all the benefits accruing therefrom under 35 U.S.C. § 119, the content of which is incorporated herein by reference in its entirety.

BACKGROUND

1. Field

The present disclosure relates to a silicon-containing structure, a method of preparing the same, a carbon composite including the silicon-containing structure, and an electrode, a lithium battery, and a device, each including the silicon-containing structure.

2. Description of the Related Art

Silicon has a theoretical capacity of about 4,200 milliampere hours per gram (mAh/g) and a relatively low cost, and thus has been considered for use as a negative electrode material in a lithium ion battery. However, silicon may undergo a large volume expansion due to the generation of a $Li_{4.4}Si$ alloy during discharge of the battery, and thus an electrically isolated active material may be generated in the electrode. Furthermore, an increase in the specific surface area of silicon may accelerate an electrolyte decomposition reaction. Therefore, it would be beneficial to develop a structure capable of suppressing the volumetric expansion of silicon and subsequent pulverization which occurs during the volumetric expansion of silicon

SUMMARY

Provided is a silicon-containing structure and a method of preparing the same.

Provided is a carbon composite including the silicon-containing structure and a carbonaceous material.

Provided is a lithium battery including an electrode, the electrode including the silicon-containing structure and/or a carbon composite including the silicon-containing structure and a carbonaceous material.

Provided is a device including the silicon-containing structure and/or including a carbon composite including the porous silicon-containing structure and a carbonaceous material Additional aspects will be set forth in part in the description which follows and, in part, will be apparent from the description, or may be learned by practice of the presented embodiments.

According to an aspect of an embodiment, a silicon-containing structure includes:
a silicon composite comprising:
a porous silicon composite secondary particle, and
a first carbon flake on a surface of the porous silicon secondary particle;
a carbonaceous coating layer on the silicon composite, the carbonaceous coating layer comprising a first amorphous carbon; and
the silicon composite comprises a second amorphous carbon and has a density that is equal to or less than a density of the carbonaceous coating layer,
wherein the porous silicon secondary particle comprises an aggregate of silicon primary particles, each comprising silicon,
a silicon suboxide on a surface of the silicon, and
a second carbon flake on a surface of the silicon suboxide.

According to an aspect of another embodiment, a carbon composite includes the above-described silicon-containing structure and a carbonaceous material.

According to an aspect of another embodiment, a lithium battery includes the above-described silicon-containing structure, a carbon composite including the silicon-containing structure and a carbonaceous material, or a combination thereof.

According to an aspect of another embodiment, a device includes the above-described silicon-containing structure, the carbon composite including the silicon-containing structure and a carbonaceous material, or a combination thereof.

In some embodiments, the device may be a field emission device, a biosensor, a semiconductor device, or a thermoelectric device.

According to an aspect of another embodiment, a method of preparing the porous silicon-containing structure includes:
providing the porous silicon secondary particle;
supplying a gas comprising a carbon source to the porous silicon secondary particle and thermally treating porous silicon secondary particle to prepare the silicon composite;
combining the silicon composite, the first amorphous carbon, and an additive; and
forming the carbonaceous coating layer comprising the first amorphous carbon on a surface of the silicon composite; and
disposing the second amorphous carbon in pores of the porous silicon secondary particle to form the silicon-containing structure.

According to an aspect of another embodiment, a silicon-containing structure includes:
a silicon composite comprising a porous silicon secondary particle, and
a first carbon flake on a surface of the porous silicon secondary particle;
a carbonaceous coating layer on the silicon composite, the carbonaceous coating layer comprising a first amorphous carbon; and
the silicon composite comprises a second amorphous carbon and has a density that is equal to or less than a density of the carbonaceous coating layer,
wherein the porous silicon secondary particle comprises an aggregate of silicon primary particles, each including,
silicon,
a silicon-containing layer on a surface of the silicon, and
a second carbon flake on a surface of the silicon-containing layer,
wherein the silicon containing layer includes a silicon suboxide ($SiO_x$) (wherein 0<x<2), a thermal reaction product of the silicon suboxide ($SiO_x$) (wherein 0<x<2), or a combination thereof,
wherein the silicon-containing layer has a form including a film, a matrix, or a combination thereof, and the first carbon flake and the second carbon flake each independently have a form including a film, a particle, a matrix, or a combination thereof.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
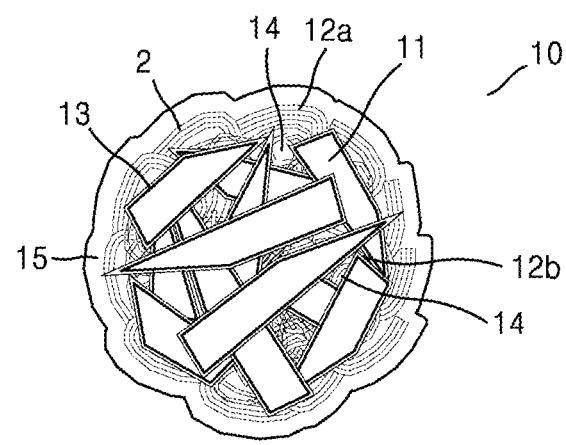
FIG. 1 is a schematic view illustrating a structure of a silicon-containing structure according to an embodiment.

Reference will now be made in detail to embodiments of at least one porous silicon composite structure, an electrode including an electrode active material that includes the porous silicon composite structure, and a lithium battery, a field emission device, a biosensor, and a semiconductor device each including the porous silicon composite structure, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. Expressions such as "at least one of," when preceding a list of elements, modify the entire list of elements and do not modify the individual elements of the list. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The formation of a coating layer of, for example, carbon on surfaces of the silicon, has been suggested as a way to address the volumetric expansion of silicon and the subsequent pulverization, which occurs during discharging of a battery. However, currently available silicon materials are still not satisfactory in terms of their ability to effectively minimize volumetric expansion and improve charging and discharging efficiency of batteries.

In accordance with an aspect of the disclosure, a silicon-containing structure includes: a silicon composite including a porous silicon secondary particle, and a first carbon flake on a surface of the porous silicon secondary particle; a carbonaceous coating layer on the silicon composite, the carbonaceous coating layer including a first amorphous carbon; and the silicon composite comprises a second amorphous carbon and has a density that is equal to or less than a density of the carbonaceous coating layer.

The density of second amorphous carbon may be equal to a density of the first amorphous carbon.

The porous silicon secondary particle may include an aggregate of silicon composite primary particles, wherein each may include silicon, a silicon suboxide ($SiO_x$) (wherein $0<x<2$) on a surface of the silicon, and a second carbon flake on a surface of the silicon suboxide. The silicon composite may include a first carbon flake on a surface of the silicon secondary particle. The silicon suboxide may be in the form of a film, a matrix, or a combination thereof, and the first carbon flake and the second carbon flake may each independently have a form including a film, a particle, a matrix, or a combination thereof.

The first carbon flake and the second carbon flake may be the same or may be different. In various embodiments, the first carbon flake and the second carbon flake are the same.

As used herein, the term "silicon suboxide" refers to a compound represented by SiOx, wherein $0<x<2$. The term "silicon suboxide" may be interpreted to include the term "silicon suboxide-like".

As used herein, the term "silicon suboxide-like" refers to a mixture of compounds having an average composition that may be represented by SiOx (wherein $0<x<2$) and includes, for example, Si and $SiO_2$.

The density of the silicon composite and the carbonaceous coating layer may be evaluated by measuring, for example, the porosity of the silicon composite and the porosity of the carbonaceous coating layer, respectively. The silicon composite may have a density that may be equal to or less than a density of the carbonaceous coating layer. The silicon composite may have a porosity of about 60% or less, or about 50% or less or about 30% or less. For example, the silicon composite may have a porosity of greater than 0 to about 60%, or about 5% to about 60%, or about 30% to about 60%. Alternatively, the silicon composite may have a non-porous structure. As used herein, "non-porous structure" may refer to a structure which is substantially devoid of pores. For example, a non-porous silicon composite may have a porosity of about 10% or less, for example, about 5% or less, about 1% or less, or 0%, or may be from 0% to about 10%, or 0% to about 5%, or about 0.01% to about 5%. The porosity may be measured by Hg intrusion porosimetry.

The porosity and density may be inversely proportional. For example, it can be said that the porosity of the carbon-based coating film is smaller than that of the silicon composite and the density thereof is large.

Figure 2:
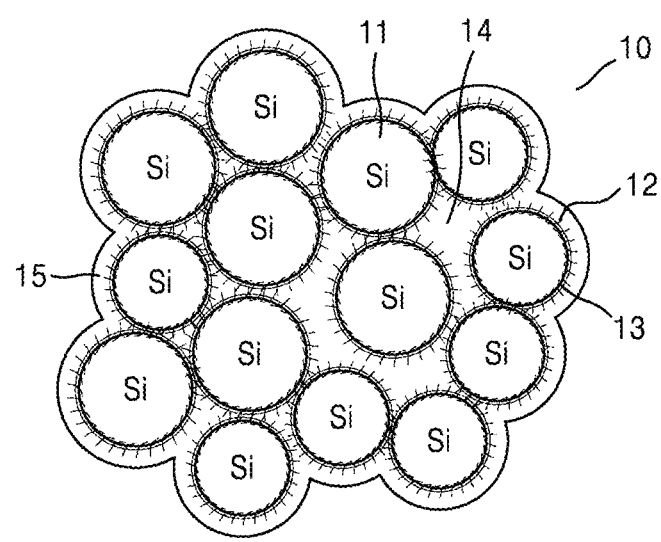
FIG. 2 is a schematic view illustrating a structure of a silicon-containing structure according to another embodiment.

FIG. 1 is an illustration of a structure of a silicon-containing structure according to an embodiment, wherein the carbon flakes (e.g., second carbon flakes) on the silicon composite primary particles have a planar and needle-like form. FIG. 2 is an illustration of a structure of a silicon-containing structure according to another embodiment, wherein the silicon is in the form of spherical particles, and the first carbon flakes (e.g., the carbon flakes on the porous silicon secondary particle) and the second carbon flakes (e.g., the carbon flakes on the silicon composite primary particles) are the same.

Referring to FIG. 1, a silicon-containing structure 10 according to an embodiment may include at least one porous silicon secondary particle, and the porous silicon secondary particle may include an aggregate of silicon composite primary particles. The silicon composite primary particles may include silicon 11, a silicon suboxide 13 (SiOx, wherein $0<x<2$) on at least one surface of the silicon 11, and a second carbon flake 12b on a surface of the silicon suboxide 13. The porous silicon secondary particle may include a first carbon flake 12a on a surface thereof and a carbonaceous coating layer 15 including a first amorphous carbon may be on the first carbon flake 12a. The first carbon flake 12a and the second carbon flake 12b may have a carbon density which is less than the carbon density of the first amorphous carbon of the carbonaceous coating layer 15. The carbon of the first carbon flake 12a and the second carbon flake 12b present on the surface of the silicon 11 may effectively buffer a volumetric change which occurs in the silicon, while the first amorphous carbon of the carbonaceous coating layer 15 on an external surface of the silicon composite may improve physical stability of the silicon-containing structure 10 and effectively inhibit a side reaction between the silicon and an electrolyte during charging and discharging.

The first carbon flake 12a and the second carbon flake 12b may be the same. The silicon-containing structure 10 may include the silicon composite and the carbonaceous coating layer 15 including a first amorphous carbon 14. The silicon-containing structure may also include a second amorphous carbon 14. For example, the silicon composite may include the second amorphous carbon 14, and more specifically, pores in the porous silicon secondary particle may include the second amorphous carbon 14. The carbonaceous coating layer 15 may include high-density amorphous carbon.

Referring to FIG. 2, in a silicon-containing structure 10 according to another embodiment, silicon 11 may have a spherical particle shape, which differs from the shape of the silicon 11 in the embodiment of FIG. 1. The embodiment of FIG. 2 corresponds to the case where the first carbon flake and the second carbon flake are the same. For example, the first carbon flake and the second carbon flake are both a graphene flake 12, and the silicon composite or pores therein (e.g., pores in the porous silicon secondary particle) include the second amorphous carbon 14.

The density of the silicon composite may be equal to or less than a density of the carbonaceous coating layer 15 on the silicon composite. The density may be evaluated by measuring, for example, the porosity of the silicon composite and/or the carbonaceous coating layer.

In FIGS. 1 and 2, the second amorphous carbon 14 in the silicon composite may be between the silicon composite primary particles and/or between silicon secondary particles. The silicon composite primary particles may each include the silicon 11, the silicon suboxide 13 (SiOx, wherein 0<x<2) on a surface of the silicon 11, and the second carbon flake 12b on a surface of the silicon suboxide 13.

The silicon composite structures of FIGS. 1 and 2 may be non-porous dense structures in which the pores in each structure are filled with compact amorphous carbon. Accordingly, when the silicon composite structure having such a structure is used as a negative active material in a lithium battery, side reactions between the silicon composite and a liquid electrolyte may be suppressed during charging and discharging of the lithium battery, and volumetric changes of the silicon may be effectively buffered such that a ratio of expansion, resulting from a physical volume expansion, is reduced and mechanical properties of the silicon-containing structure are maintained. Even when an electrolyte containing an organic solvent such as fluoroethylene carbonate is used, battery performance in terms of lifespan and high-rate characteristics may be improved.

As used herein, the "silicon suboxide" refers to a silicon oxide having the formula SiO$_x$, wherein 0<x<2.

In some embodiments, in the silicon composite primary particles, the silicon suboxide (SiO$_x$) (wherein 0<x<2) may cover at least one surface of the silicon, and the first carbon flake may cover at least one surface of the silicon suboxide.

In some embodiments, the first carbon flake may cover at least one surface of the porous silicon secondary particle.

The second carbon flake may be directly disposed on the silicon suboxide, and the first carbon flake may be directly disposed on the porous silicon secondary particle. The second carbon flake may entirely or partially cover the surface of the silicon suboxide. For example, a coverage ratio of the silicon suboxide may be about 10% to about 100%, or about 10% to about 99%, and in some embodiments, about 22% to about 95%, and in some other embodiments, about 40% to about 90%, based on a total surface area of the silicon suboxide. The second carbon flake may be directly grown (disposed) on the surface of the silicon suboxide of the silicon composite primary particles.

The second carbon flake may be directly disposed on the surface of the silicon suboxide by being directly grown on the surface of the silicon suboxide. The first carbon flake may be directly disposed on the surface of the porous silicon secondary particle by directly being grown on the surface of the porous silicon secondary particle.

The first carbon flake may entirely or partially cover the surface of the porous silicon secondary particle. For example, a coverage ratio of the first carbon flakes may be about 5% to about 100%, or about 10% to about 99%, and in some embodiments, about 20% to about 95%, and in some other embodiments, about 40% to about 90%, based on a total surface area of the porous silicon secondary particle.

According to embodiments, the silicon-containing structure may include a core composed of the silicon composite, and an inner shell including the first carbon flake disposed on and surrounding the core. Due to the presence of carbon in the form of flakes in the shell, the silicon in the silicon composite core may easily contact the carbon flakes when volume expansion of the silicon-containing structure occurs. The core of the silicon-containing structure may include pores, which may serve as a buffer space when the structure expands. The silicon-containing structure may include a carbonaceous coating layer, which includes high-density amorphous carbon, and acts as a protective outer shell to suppress permeation of a liquid electrolyte. The outer shell composed of the carbonaceous coating layer may protect the core of the structure from being physically suppressed. The carbonaceous coating layer may include amorphous carbon as described above to facilitate migration of lithium ions during charging and discharging. The carbonaceous coating layer may entirely or partially cover the total surface area of the silicon composite. For example, a coverage ratio of the carbonaceous coating layer may be about 5% to about 100%, or about 10% to about 99%, and in some embodiments, about 20% to about 95%, and in some other embodiments, about 40% to about 90%, based on the total surface area of the silicon composite.

The silicon-containing structure according to one or more embodiments may have a non-spherical shape. For example, the silicon-containing structure may have a circularity of about 0.9 or less, or about 0.8 or less, or about 0.7 or less, and in some embodiments, about 0.5 to about 0.9, or about 0.7 to about 0.9, and in some other embodiments, about 0.85 to about 0.9.

As used herein, the circularity is calculated using Equation 1, wherein A is the area and P is the perimeter.

$$\text{circularity} = \frac{4\pi A}{P^2} \qquad \text{Equation 1}$$

The first carbon flake and the second carbon flake may include any carbonaceous material having a flake shape. Any carbonaceous materials in the form of flakes may be used as the carbon flakes. Examples of the carbonaceous material include graphene, graphite, carbon fiber, graphitic carbon, graphene oxide, or a combination thereof.

In some embodiments, the silicon composite may include a first graphene and a second graphene, as the first carbon flake and the second carbon flake. The first graphene and the second graphene may have a structure including, for example, a nanosheet, a layer (e.g. a film), a flake, or a combination thereof. As used herein, the term "nanosheet" refers to a material having a two-dimensional structure in the form of a sheet having a thickness of less than about 1000 nanometers (nm), or a thickness in a range of about 1 nm to about 1000 nm, and which is disposed in an irregular manner on the silicon suboxide or on the porous silicon secondary particle. As used herein, the term "layer" refers to a continuous, uniform film formed on the silicon suboxide or on the porous silicon secondary particle.

The amorphous carbon of the carbonaceous coating layer may include pitch carbon, soft carbon, hard carbon, mesophase pitch carbides, sintered cokes, carbon fiber, or a combination thereof.

The carbonaceous coating layer may further include crystalline carbon. When the carbonaceous coating layer further includes crystalline carbon, the carbonaceous coating layer may smoothly perform buffering action against volume expansion of the silicon composite.

The crystalline carbon may include natural graphite, artificial graphite, graphene, fullerene, carbon nanotubes, or a combination thereof.

A total mixed ratio of the carbon (hereinafter, "first carbon") of the first and second carbon flakes in the porous silicon composite to the carbon (hereinafter, "second carbon") of the carbonaceous coating layer may be about 30:1 to about 1:3 by weight, and in some embodiments, about 20:1 to about 1:1 by weight, and in some other embodiments, about 10:1 to about 1:0.9 by weight. The term "first carbon" refers to a total of the first carbon flakes and the second carbon flakes. When a ratio of the first carbon to the second carbon is within these ranges, a lithium battery having improved discharge capacity and improved capacity retention may be manufactured.

The mixed ratio of the first carbon to the second carbon may be determined by thermogravimetric analysis (TGA). The first carbon is associated with peaks appearing at about 700° C. to 750° C., and the second carbon is associated with peaks appearing at about 600° C. to 650° C.

The TGA may be performed, for example, at a temperature of 25° C. to about 1,000° C. under atmospheric conditions with a rate of temperature increase of about 10° C./min.

In some embodiments, the first carbon may be crystalline carbon, and the second carbon may be amorphous carbon.

A mixed ratio of a total weight of the first carbon flake and the second carbon flake to a total weight of the first amorphous carbon and the second amorphous carbon may be about 1:99 to about 99:1, or about 1:20 to about 80:1, or for example, about 1:1 to about 1:10.

The weight ratio of the first amorphous carbon to the second amorphous carbon may be about 1:1.1 to about 1:3, for example about 1:1.4 to about 1:2.5, for example about 1:1.5 to about 1:2.3, for example, about 1:1.7 to about 1:2, for example, about 1:1.9.

The silicon composite may be a porous silicon composite cluster.

As used herein, the term "cluster" refers to an aggregate of two or more primary particles, and may be construed as having substantially the same meaning as "secondary particle."

As used herein, the term "graphene" refers to a structure having the form of flakes, nanosheets, or a layer (e.g., film), wherein the nanosheets may refer to a structure disposed in an irregular manner on a surface of the silicon suboxide or on a surface of the porous silicon secondary particle, and the layer may refer to structure disposed as a continuous, uniform film of graphene on the silicon suboxide or on the porous silicon secondary particle. As such, the graphene may have a structure including distinct layers or a structure without any distinct layers.

In some embodiments, the porous silicon secondary particle of the silicon composite may have a particle size of about 1 μm to about 20 μm, or about 2 μm to about 18 μm, or about 3 micrometers (μm) to about 10 μm, and the carbon flakes may have a size of about 1 nanometer (nm) to about 200 nm, or about 5 nm to about 150 nm, or about 10 nm to about 100 nm. The term "size" used herein may refer to a diameter or a dimension, such as a dimension along a major surface.

A diameter ratio of the porous silicon secondary particle to the silicon composite may be about 1:1 to about 1:30, and in some embodiments, about 1:2 to about 1:30, and in some other embodiments, about 1:5 to about 1:25, and in still other embodiments, about 1:21. The diameter ratio of the porous silicon secondary particle to the silicon composite may refer to a ratio of the particle size of the porous silicon secondary particle to the silicon composite when both have a spherical shape, or may refer to a ratio of the major axis of the porous silicon secondary particle to the porous silicon composite when both are non-spherical.

In some embodiments, the porous silicon secondary particle (core) in the silicon composite may have a diameter of about 1 μm to about 20 μm, or about 2 μm to about 15 μm, or about 3 μm to about 10 μm, and the carbonaceous coating (shell) may have a thickness of about 10 nm to about 5,000 nm (about 0.01 μm to about 5 μm), for example, about 10 nm to about 1,000 nm, or about 10 nm to about 500 nm. A ratio of the diameter of the core of the silicon composite to the thickness of the shell (carbonaceous coating layer) in the silicon-containing structure may be about 1:0.001 to about 1:1.67, and in some embodiments, about 1:0.01, about 1:1.67, about 1:0.0033, or about 1:0.5.

A total amount of the first carbon flake and the second carbon flake in the silicon composite may be about 0.1 parts to about 2,000 parts by weight, and in some embodiments, about 0.1 parts to about 300 parts by weight, and in some other embodiments, about 0.1 parts to about 90 parts by weight, and in some other embodiments, about 5 parts to about 30 parts by weight, based on 100 parts by weight of the silicon. When the total amount of the carbon flakes is within these ranges, volume expansion of the silicon may be effectively suppressed, and improved conductivity may be obtained.

The first and second carbon flakes may be, for example, graphene flakes.

The second carbon flake of the silicon composite primary particle may be a graphene flake. The graphene flake may be spaced from the silicon of the silicon suboxide ($SiO_x$) (wherein 0<x<2) by a distance of about 10 nm or less, for example, about 5 nm or less, about 3 nm or less, or about 1 nm or less. The second carbon flake may have a total thickness of about 0.3 nm to about 1,000 nm, and in some embodiments, about 0.3 nm to about 50 nm, and in some other embodiments, about 0.6 nm to 50 nm, and in still other embodiments, about 1 nm to 30 nm. The graphene flake may be oriented at an angle of about 0° to about 90°, for example, about 10° to about 80°, or about 20° to about 70°, with respect to a major axis (for example, Y-axis) of the silicon composite primary particle. As used herein, the major axis may refer to the Y-axis. The graphene flake of the silicon composite primary particle may also be referred to as a second graphene flake.

In some embodiments, the first carbon flake of the porous silicon secondary particle may be a graphene flake. For example, the graphene flake may be spaced from the silicon of the silicon suboxide ($SiO_x$) (wherein 0<x<2) by a distance of about 1,000 nm or less, and in some embodiments, about 500 nm or less, and in some other embodiments, about 10 nm or less, and in still other embodiments, about 1 nm or less, and in yet other embodiments, about 0.00001 nm to about 1 nm, or about 0.00001 nm to about 0.1 nm, or about 0.00001 nm to about 0.01 nm. For example, a total thickness of the graphene flake may be about 0.3 nm to about 50 nm, and in some embodiments, about 1 nm to about 50 nm. The graphene flake may be oriented at an angle of 0° to about 90°, and in some embodiments, about 10° to about 80°, and in some other embodiments, about 20° to about 70°, with respect to a major axis (for example, Y-axis) of the porous silicon secondary particle. The graphene flake of the porous silicon secondary particle may also be referred to as a first graphene flake.

For example, the graphene flake may include at least one graphene layer, for example, about 1 to about 50 graphene layers, or about 1 to about 40 graphene layers, or about 1 to about 30 graphene layers, or about 1 to about 20 graphene layer.

For example, a thickness of the silicon suboxide ($SiO_x$) (wherein 0<x<2) on the surface of the silicon may be about 30 μm or less, and in some embodiments, about 10 μm or less, or about 1 μm or less, and in some other embodiments, about 1 nm to about 100 nm, or about 1 nm to about 50 nm, or about 1 nm to about 20 nm, and in some other embodiments, about 10 nm. The silicon suboxide may entirely or partially cover the surface of the silicon. For example, a coverage ratio of the silicon suboxide may be 100%, or about 10% to about 100%, or about 10% to about 99%, and in some embodiments, about 20% to about 95%, and in some other embodiments, about 40% to about 90%, based on the total surface area of the silicon.

The silicon is not limited to a specific form and may have any shape, for example, a sphere, a nanowire, a needle, a rod, a particle, a nanotube, a nanorod, a wafer, a nanoribbon, or a combination thereof. The silicon may have an average size of about 10 nm to about 30 µm, or about 10 nm to about 1,000 nm, and in some embodiments, about 20 nm to about 150 nm, and in some other embodiments, about 100 nm. The average size of the silicon may refer to an average particle diameter when the silicon is in the form of a spherical particle, or may refer to a dimension, such as a dimension along a major surface, when the silicon is in the form of a non-spherical particle, for example, a planar particle or a needle-like particle.

The porous silicon secondary particle may have D50 particle size of about 200 nm to about 50 µm, and in some embodiments, about 1 µm to about 30 µm, and in some embodiments, about 2 µm to about 25 µm, and in some embodiments, about 3 µm to about 20 µm, and in some other embodiments, about 1 µm to about 15 µm, and in still other embodiments, about 7 µm to about 11 µm. For example, the porous silicon secondary particle may have a D10 particle size of about 0.001 µm to about 10 v, and in some embodiments, about 0.005 µm to about 5 µm, and in some other embodiments, about 0.01 µm to about 1 µm. For example, the porous silicon secondary particle may have a D90 particle size of about 10 µm to about 60 µm, and in some embodiments, about 12 µm to about 28 µm, and in some other embodiments, about 14 µm to about 26 µm. As used herein, the term "D50 particle size" refer to a particle diameter corresponding to 50% of the particles in a cumulative distribution curve in which particles are accumulated in the order of particle diameter from the smallest particle to the largest particle and a total number of accumulated particles is 100%. Similarly, the terms "D10" and "D90" respectively indicate particle diameters corresponding to 10%, and 90% of the particles in the cumulative distribution curve of the porous silicon secondary particle, respectively.

The porous silicon secondary particle may have a specific surface area of about 0.1 square meters per gram ($m^2/g$) to about 100 $m^2/g$, and in some embodiments, about 1 $m^2/g$ to about 30 $m^2/g$, and in some other embodiments, about 1 $m^2/g$ to about 5 $m^2/g$. The porous silicon secondary particle may have a density of about 0.1 grams per cubic centimeter (g/cc) to about 2.8 g/cc, and in some embodiments, about 0.1 g/cc to about 2.57 g/cc, and in some other embodiments, about 0.5 g/cc to about 2 g/cc.

The silicon composite may further include a carbonaceous coating layer on a surface thereof. When the silicon composite further includes the carbonaceous coating layer, a lithium battery having improved lifetime characteristics may be obtained.

A ratio of a diameter of the silicon composite to a thickness of the carbonaceous coating layer may be about 1:1 to about 1:50, and in some embodiments, about 1:1 to about 1:40, and in some other embodiments, about 1:0.0001 to about 1:1. The carbonaceous coating layer may have a thickness of about 1 nm to about 5,000 nm, or about 5 nm to about 2,500 nm, for example, about 10 nm to about 2,000 nm.

The carbonaceous coating layer may have a single-layer structure, the single layer including amorphous carbon and crystalline carbon. The carbonaceous coating layer may have a two-layer structure having first carbonaceous coating layer including amorphous carbon and a second carbonaceous coating layer including crystalline carbon. For example, the carbonaceous coating layer may have a structure in which the first carbonaceous coating layer including amorphous carbon and the second carbonaceous coating layer including crystalline carbon are sequentially stacked on the silicon composite in this order, or alternatively, a structure in which the second carbonaceous coating layer including crystalline carbon and the first carbonaceous coating layer including amorphous carbon are sequentially stacked on the silicon composite in this order.

The silicon composite may have a narrow particle size distribution. For example, the silicon composite (secondary particle) may have a D50 particle size of about 1 µm to about 30 µm, a D10 particle size of about 0.001 µm to about 10 µm, and a D90 particle size of about 10 µm to about 60 µm. The silicon composite according to one or more embodiments may have a narrow particle size distribution within these ranges. Unlike the silicon composite described herein according to the one or more embodiments, conventional silicon secondary particles obtained from silicon composite primary particles, may have a broader and irregular secondary particle size distribution, and thus it may be difficult to control a particle size of a negative active material so as to improve the cell performance.

Graphene may suppress the disintegration and/or pulverization of silicon particles which may occur in conventional, graphene-grown silicon primary particles. Without being limited by theory, it is believed that the graphene, including sliding layers, may serve as a clamping layer which prevents disintegration of silicon particles, while also allowing for an alloying reaction between lithium ions and silicon (Si) to thereby yield a significant specific capacity and provide a continuous conduction pathway between the particles.

The graphene layers may slide over one another when the silicon particles swell during charging, and then slide back to their relaxed positions during delithiation. Without being limited by theory, it is understood that this movement of the graphene layers occurs because van der Waals forces are greater than the force of friction between the layers.

The clamping effect of the graphene layers, which serve as a clamping layer to prevent disintegration of silicon particles, may be confirmed by evaluating whether the graphene layers remain as they are (e.g., are unaffected) after repeated lithiation/delithiation cycles.

In some embodiments, the silicon composite may have improved capacity characteristics, for example, a volumetric capacity of about 600 milliampere hours per cubic centimeter (mAh/cc) to about 2,000 mAh/cc.

According to an embodiment, a silicon-containing structure includes: a silicon composite including a porous silicon secondary particle, and a first carbon flake on a surface of the porous silicon secondary particle; a carbonaceous coating layer on the silicon composite, the carbonaceous coating layer including a first amorphous carbon; and the silicon composite comprises a second amorphous carbon and has a density that is equal to or less than a density of the carbonaceous coating layer, wherein the porous silicon secondary particle may include an aggregate of silicon composite primary particles, each including silicon, a silicon-containing layer on a surface of the silicon, and a second carbon flake on a surface of the silicon-containing layer, wherein the silicon-containing layer includes a silicon suboxide, a thermal reaction product of a silicon suboxide, or a combination thereof.

The density of second amorphous carbon may be equal to a density of the first amorphous carbon.

The silicon suboxide may have a form of a film, a matrix, or a combination thereof, and the first carbon flake and the second carbon flake may each independently have a form including a film, a particle, a matrix, or a combination thereof.

In some embodiments, the silicon composite may have the same structure as the silicon composite according to the above-described embodiments, except that the carbonaceous coating layer including the first amorphous carbon, disposed on the silicon composite, is not included.

As used herein, the expression "thermal reaction product of a silicon suboxide" may refer to a product obtained by thermally treating the silicon suboxide ($SiO_x$, wherein 0<x<2). The thermal treatment may refer to a thermal treatment for growing carbon (graphene) flakes on the silicon suboxide ($SiO_x$, wherein 0<x<2) by a vapor deposition method (reaction). During the vapor deposition reaction, a carbon source gas or a gas mixture including a carbon source gas and a reducing gas may be used as a source for the formation of the carbon (graphene) flake. The reducing gas may be, for example, hydrogen.

In some embodiments, the thermal reaction product of the silicon suboxide ($SiO_x$, wherein 0<x<2) may be obtained by thermally treating the silicon suboxide ($SiO_x$, wherein 0<x<2) in an atmosphere including a carbon source gas or a gas mixture including a carbon source gas and a reducing gas.

In some embodiments, the thermal reaction product of the silicon suboxide ($SiO_x$, wherein 0<x<2) may be a structure including silicon (Si) in a matrix of $SiO_y$, wherein 0<y≤2.

In some other embodiments, the thermal reaction product of the silicon suboxide may include: i) a structure including silicon (Si) in a matrix of silicon dioxide ($SiO_2$), ii) a structure including silicon (Si) arranged in a matrix including silicon dioxide ($SiO_2$) and silicon suboxide ($SiO_x$, wherein 0<x<2), or iii) a structure including silicon (Si) arranged in a matrix of a silicon suboxide ($SiO_x$, wherein 0<x<2). Put another way, the thermal reaction product of the silicon suboxide includes silicon in a matrix comprising $SiO_2$, $SiO_x$, wherein 0<x<2, or a combination thereof.

Hereinafter, a method of preparing the silicon-containing structure according to one or more embodiments will be described.

First, a structure including silicon and silicon suboxide ($SiO_x$, wherein 0<x<2) on the silicon may be pulverized to obtain silicon primary particles. The silicon primary particles may have, for example, a flat or needle-like shape.

The pulverized silicon primary particles may be mixed with a dispersing agent and a solvent to thereby obtain a first composition. Next, porous silicon secondary particles may be prepared from the first composition. The porous silicon secondary particles may include pores and may have a porosity of, for example, about 0.1% to about 50%, and in some embodiments, about 1% to about 40%, and in some other embodiments, about 5% to about 30%, and have a pore size of, for example, about 10 nm to about 500 nm, and in some embodiments, about 20 nm to about 200 nm, and in some other embodiments, about 30 nm to about 300 nm.

The porous silicon secondary particles may be prepared from the composition by any of a variety of methods, for example, co-precipitation, spray drying, or a solid phase method. For example, the porous silicon secondary particles may be prepared by spray drying. When the porous silicon secondary particles are prepared by spray drying, a particle diameter thereof may be controlled by appropriately choosing a spraying type, a pressurized gas supply rate, a composition supply rate, a drying temperature, and the like.

The spray drying may be performed at an atmospheric temperature of about room temperature (25° C.) to about 500° C., for example, about 50° C. to about 300° C., and in some embodiments, about 50° C. to about 250° C., and in some other embodiments, about 70° C. to about 200° C. When the spray drying is performed within these temperature ranges, agglomeration and blocking of a particle discharge outlet due to moisture condensation near the particle discharge outlet may be prevented, and the porous silicon secondary particles may have appropriate porosity.

In the spray drying, a spraying pressure may be about 1 bar to about 5 bar.

Prior to the spray drying, a surface area of the starting material may be increased as much as possible, for example, by pulverization. To this end, pulverized silicon primary particles may be used as a starting material.

For example, when the porous silicon secondary particles are formed using spray drying, the obtained porous silicon secondary particles may be spherical in shape. The dispersing agent, for example, stearic acid, may partially remain on a surface of the porous silicon secondary particles. Next, while a carbon source gas is supplied, the porous silicon secondary particles may be thermally treated, so that carbon flakes may be distributed on the surface of the porous silicon secondary particles, thereby preparing a silicon composite. The spray drying nozzle size is about 1 μm to about 10 μm, for example, about 5 μm. and the spray nozzle was about 0.3 MPa to about 0.6 MPa, for example, about 0.5 MPa A carbonaceous coating layer may then be formed on the porous silicon composite (core), to thereby obtain a silicon-containing structure.

After the pores in the porous silicon secondary particles are filled with the carbon source gas, carbon flakes may grow on external surfaces of the porous silicon secondary particles and on exposed surfaces of the silicon composite primary particles, that is, on surfaces of the silicon composite primary particles defining the pores.

The solvent may be an alcohol. The alcohol may be, for example, ethanol, methanol, isopropyl alcohol, or a combination thereof. When these alcohol solvents are used, the dispersing agent may be removed as the solvent is removed, so that an amount of the dispersing agent remaining in the silicon composite may be minimal. As a result, an amount of oxygen remaining in pores of the porous silicon secondary particles may be reduced so that only a small amount of oxygen may remain.

The dispersing agent may uniformly disperse the silicon primary particles. Non-limiting examples of the dispersing agent may include stearic acid, resorcinol, polyvinyl alcohol, carbon pitch, or a combination thereof. The amount of the dispersing agent may be about 1 part to about 15 parts by weight, for example, about 5 parts to about 10 parts by weight, based on 100 parts of a total weight of the composition. When the amount of the dispersing agent is within these ranges, silicon and graphene may be uniformly dispersed without agglomerating.

The carbon source gas may include a compound represented by Formula 1, a compound represented by Formula 2, a first oxygen-containing gas represented by Formula 3, or a combination thereof.

$$C_nH_{(2n+2-a)}[OH]_a \qquad \text{Formula 1}$$

In Formula 1, n may be an integer of 1 to 20, for example, an integer of 2 to 18, or an integer of 4 to 16, and a may be 0 or 1.

$$C_nH_{(2n)} \quad \text{Formula 2}$$

In Formula 2, n may be an integer of 2 to 6

$$C_xH_yO_z \quad \text{[Formula 3]}$$

In Formula 3, x may be an integer of 1 to 20, for example, an integer of 2 to 18, or an integer of 4 to 16; y may be 0 or an integer of 1 to 20, or an integer of 2 to 18; and z may be 1 or 2.

The carbon source gas may be, for example, methane, ethylene, propylene, methanol, ethanol, propanol, acetylene, or a combination thereof.

The thermal treatment may be performed at a temperature of about 600° C. to about 1,100° C., or about 650° C. to about 1,000° C., and in some embodiments, about 700° C. to about 1,000° C. When the thermal treatment is performed within these temperature ranges, carbon (e.g., graphene) flakes may be generated in the core and/or the shell both at a high density.

When the carbon flakes include carbon nanotube flakes, carbon fiber flakes, graphitic carbon flakes, and/or graphene oxide flakes, the carbon flakes may be prepared using a method known in the art.

The prepared silicon composite, amorphous carbon, a precursor thereof, or a combination of the amorphous carbon and a precursor of the amorphous carbon, and an additive, may be mixed together to prepare a second composition. Using the second composition, the carbonaceous coating layer including the first amorphous carbon may be formed on the surface of the porous silicon secondary particle and the second amorphous carbon may be supplied into the pores of the porous silicon secondary particle (second amorphous carbon), thereby preparing the silicon-containing structure.

The mixing of the second composition may be performed in a dry manner.

The mixing in a dry manner ("dry mixing") may be followed by a thermal treatment. This thermal treatment may be performed under an inert gas atmosphere at a temperature of about 500° C. to about 1,100° C., or about 750° C. to about 1,100° C., and in some embodiments, at about 950° C. to about 1050° C.

The dry mixing may be performed using a mixer in which mixing is performed without a structure for applying a physical force to distribute the materials to be dry-mixed. The mixer may be a revolution and rotation type centrifugal mixer such as a planetary mixer. The revolution and rotation type centrifugal mixer may simultaneously rotate and revolve in a vacuum or non-vacuum condition. The rotation and revolution may each independently be performed at an agitation speed of about 2,000 rotations per minute (rpm) or less, for example, about 1000 rpm or less.

The structure for applying a physical force to the materials may refer to a rotor, a ball, or the like, that may apply, for example, an impact force to the materials.

Using the above-described revolution and rotation type centrifugal mixer may minimize damage to and changes in the materials to be dry-mixed. The revolution and rotation type centrifugal mixer may be, for example, a planetary mixer or a planetary dispenser mixer. The revolution and rotation type centrifugal mixer is commercially available under the product name of THINKY MIXER™ (Thinky Corporation).

The materials may be uniformly mixed by alternately performing agitation and degassing steps with appropriate control of the revolution and rotation speeds by using the planetary centrifugal mixer.

The agitation step may be performed at a revolution speed of about 1,000 rpm or less, or about 900 rpm or less, or about 750 rpm or less, and a rotation speed of about 1,000 rpm or less. The degassing step may be performed at a revolution speed of about 2,000 rpm or less, or about 1,750 rpm or less, or about 1,500 rpm or less and a rotation speed of about 100 rpm or less, for example, about 10 rpm to about 100 rpm. When the revolution speed and the rotation speed in the agitation and degassing steps are within these ranges, the materials may be uniformly mixed with minimal damage and change to the materials.

The dry mixing may be performed by inputting the materials several times in separate portions, for example, in 4 steps, rather than by bulk all at once. This may ensure effective infiltration of the carbon into the pores of the porous silicon secondary particles. Using the above-described mixer, a dense structure in which the silicon composite is filled with amorphous carbon may be formed, while the shape of the silicon composite is maintained.

In the dry mixing, an additive may be used to facilitate uniform mixing. The additive may be, for example, N-methylpyrrolidone, isopropyl alcohol (IPA), dimethylformamide, butanol, acetone, or a combination thereof. When these additives are added in the dry mixing, the additives may dissolve ingredients such as an amorphous carbon precursor to facilitate inflow of the ingredients into the silicon composite and may improve binding strength between the ingredients during the dry mixing. The additives may also be spontaneously removed due to their strong volatility. The amount of the additive may be about 25 parts by weight or less, for example, about 10 parts to about 25 parts by weight, or about 12 parts to about 25 parts by weight with respect to 100 parts by weight of the ingredients to be mixed in a dry manner. In a wet mixing, unlike the dry mixing, the amount of the additive may be greater than about 25 parts by weight, for example, about 26 parts to about 150 parts by weight, or about 30 parts to about 150 parts by weight, or about 50 parts to about 125 parts by weight, with respect to 100 parts by weight of the total ingredients to be mixed in a wet manner. The amorphous carbon precursor may be, for example, citric acid, coal tar pitch, or the like.

The amount of the additive in the second composition may be about 25 parts by weight or less, and in some embodiments, about 10 parts to about 25 parts by weight, and in some other embodiments, about 12 parts to about 25 parts by weight, each based on 100 parts by weight of a total weight of the solid content of the second composition. The solid content includes the silicon composite, and the amorphous carbon, a precursor thereto, or a combination of the amorphous carbon and a precursor of the amorphous carbon.

In some embodiments, the dry mixing may be performed through temperature control to about 25° C. or less, for example, a range of about 15° C. to about 25° C.

In some other embodiments, the dry mixing may be performed under a thermal treatment condition at about 30° C. to about 80° C., and in some embodiments, about 50° C. to about 80° C., and in some other embodiments, about 60° C. to about 70° C.

In the second composition including the silicon composite, the amorphous carbon, and the additive, the amount of the amorphous carbon may be about 1 part to about 75 parts by weight, or about 3 parts to about 60 parts by weight, and in some embodiments, about 5 parts to about 30 parts by weight, based on 100 parts by weight of the silicon composite.

Under the above-described conditions, the amorphous carbon may be effectively infiltrated into the silicon composite. When the amorphous carbon is infiltrated into the silicon composite, a side reaction with a liquid electrolyte may be suppressed after charging and discharging, and physical volumetric expansion ratio characteristics may be improved.

As described above, the silicon composite primary particles may include silicon, silicon suboxide ($SiO_x$, wherein $0<x<2$) on a surface of the silicon, and carbon flake (graphene) on the silicon suboxide. The silicon suboxide ($SiO_x$, wherein $0<x<2$) is an unstable oxygen-deficient material as compared with silicon dioxide ($SiO_2$), and tends to form a stable material by reaction with another reactive material, such as a carbon source gas. Based on this tendency, the silicon suboxide ($SiO_x$, wherein $0<x<2$) may be used as a seed layer for forming graphene on a surface thereof.

A thickness of the silicon suboxide ($SiO_x$, wherein $0<x<2$) layer on the silicon surface may directly affect a shape and/or a structure of the graphene.

The thickness of the silicon suboxide ($SiO_x$, wherein $0<x<2$) layer may be varied by controlling a process involved in graphene formation, for example, by controlling a composition of the carbon source gas used for forming graphene. The thickness of the silicon suboxide ($SiO_x$, wherein $0<x<2$) layer may be about 300 nm or less, or about 100 nm or less, or about 10 nm or less.

In some embodiments, the silicon suboxide ($SiO_x$, wherein $0<x<2$) layer may have a thickness of about 10 nm or less, and in some other embodiments, about 0.1 nm to about 10 nm, or about 0.4 nm to about 7.5 nm, and in still other embodiments, about 0.1 nm to about 5 nm. When the thickness of the silicon oxide layer is within these ranges, a lithium battery manufactured using the silicon-containing structure including the silicon suboxide ($SiO_x$, wherein $0<x<2$) may have improved capacity.

In some embodiments, by non-catalytic vapor carbon deposition, the graphene may be formed on the silicon suboxide ($SiO_x$, wherein $0<x<2$) layer on the silicon.

The vapor carbon deposition may include thermally treating the silicon covered with the silicon suboxide ($SiO_x$) under a gas atmosphere including a gas including a compound represented by Formula 1, a compound represented by Formula 2, a first oxygen-containing compound represented by Formula 3, or a combination thereof.

$$C_nH_{(2n+2-a)}[OH]_a \qquad \text{Formula 1}$$

In Formula 1, n may be an integer of 1 to 20, for example, an integer of 2 to 18 or an integer of 4 to 16, and a may be 0 or 1.

$$C_nH_{(2n)} \qquad \text{Formula 2}$$

In Formula 2, n may be an integer of 2 to 6.

$$C_xH_yO_z \qquad \text{Formula 3}$$

In Formula 3, x may be an integer of 1 to 20, for example, an integer of 2 to 8, or an integer of 4 to 16; y may be 0 or an integer of 1 to 20, for example, an integer of 2 to 18 or an integer of 4 to 16; and z may be 1 or 2.

In some embodiments, the carbon source gas may further include a second oxygen-containing compound represented by Formula 3a. The second oxygen-containing compound represented by Formula 3a may differ from the first oxygen-containing compound represented by Formula 3.

$$C_xH_yO_z \qquad \text{Formula 3a}$$

In Formula 3a, x may be 0 or an integer of 1 to 20, for example, an integer of 2 to 18, or an integer of 4 to 16; y may be 0 or an integer of 1 to 20, for example, an integer of 2 to 18, or an integer of 4 to 16; and z may be 1 or 2.

According to the vapor carbon deposition, graphene may directly grow on the silicon covered with the silicon suboxide ($SiO_x$), and thus the silicon and the graphene may have strong adhesion to each other.

In some embodiments, even when a $SiO_x$ layer is not present on the silicon, by a process of reaction with a carbon-containing mixed gas and an oxygen-containing mixed gas, a $SiO_x$ layer may be formed first on the silicon by reaction with the oxygen-containing mixed gas, and then graphene may be formed thereon by reaction with the carbon-containing mixed gas.

A degree of adhesion between the silicon of the $SiO_x$ layer and the graphene may be evaluated by measuring a distance between them by scanning electron microscopy (SEM). The graphene may be spaced from the silicon of the silicon suboxide by a distance of about 10 nm or less, and in some embodiments, about 1 nm or less, and in some other embodiments, about 0.005 nm to about 1 nm. The graphene may be oriented at an angle of about 0° to about 90°, and in some embodiments, about 10° to about 80°, and in some other embodiments, about 20° to about 70°, with respect to a major axis of the silicon. The graphene may include at least 1 to 30 graphene layers (sheets), and in some embodiments, about 2 to 25 graphene layers, and in some other embodiments, about 4 to 20 graphene layers, and may have a total thickness of about 0.6 nm to about 12 nm, and in some embodiments, about 1 nm to about 10 nm, and in some other embodiments, about 2 nm to about 8 nm. The graphene may be oriented at an angle of 0° to about 90° with respect to the major axis of the silicon. As used here, the major axis may refer to a Y-axis.

The shape of the silicon may not be limited to any specific shape and, for example, may have a form of a sphere, a nanowire, a needle, a rod, a particle, a nanotube, a nanorod, a wafer, a nanoribbon, or a combination thereof.

In some embodiments, the silicon may be in the form of needle-like (needle-shaped) particles. For example, the needle-like silicon particles may have a length of about 100 nm to about 160 nm, about 100 nm to about 150 nm, and in some embodiments, about 108 nm to about 125 nm; and may have a thickness of about 10 nm to about 100 nm, and in some embodiments, about 20 nm to about 50 nm, or about 30 nm to about 50 nm, and in some other embodiments, about 40 nm.

In some embodiments, the silicon suboxide ($SiO_x$, wherein $0<x<2$) may be a layer formed on needle-like silicon, and the graphene may be formed on the silicon suboxide.

In some embodiments, the silicon suboxide ($SiO_x$, wherein $0<x<2$) may be formed on silicon nanoparticles, and the graphene may be formed on the silicon suboxide. The silicon nanoparticles may have an average particle diameter of about 40 nm to about 40 μm, or about 40 nm to about 1 μm, for example, about 40 nm to about 100 nm.

When the silicon is in the form of a wafer, the silicon wafer may have a thickness of about 2 mm or less, or about 1 mm or less, or about 0.05 mm or less, for example, about 0.001 mm to about 2 mm.

The graphene is a polycyclic aromatic molecule including a plurality of carbon atoms covalently bonded to one another, and the covalently bonded plurality of carbon atoms form a 6-membered ring as a basic repeating unit, but a 5-membered ring and/or a 7-membered ring may also be included in the graphene. Accordingly, the graphene may be a single layer of the covalently bonded carbon atoms (in general, having a $sp^2$ bond). The graphene may include a single layer, or may include multiple layers of carbon stacked upon one another, for example, one layer to about 100 layers, about 2 layers to about 100 layers, or about 3 layers to about 50 layers.

The graphene may have a structure of a nanosheet, a layer, a film, a nanographene nanosheet, or a flake, or may be a combination thereof. The term "nanosheet" may refer to a structure of graphene formed in an irregular form on the silicon suboxide. The terms "layer" and "film" may refer to a continuous, uniform structure of graphene formed on the silicon suboxide.

In some embodiments, the silicon composite may further include a metal oxide. When the silicon composite further includes a metal oxide, formation of a solid electrolyte interphase (SEI) layer may be prevented due to suppression of a side reaction.

The metal oxide may include a magnesium oxide, a manganese oxide, an aluminum oxide, a titanium oxide, a zirconium oxide, a tantalum oxide, a tin oxide, a hafnium oxide, or a combination thereof. The silicon composite may include an aluminum fluoride ($AlF_3$).

In the silicon-containing structure according to one or more embodiments, the carbon flakes (such as graphene flakes) may serve as an SEI stabilization clamping layer. The silicon-containing structure may have a relatively large specific surface area, and thus may prevent a reduction in initial efficiency and volume energy density when used in a lithium battery.

In the silicon-containing structure according to one or more embodiments, the graphene may suppress disintegration or pulverization of active materials such as silicon, and may improve conductivity of the silicon composite. The graphene may suppress disintegration or pulverization of silicon particles. The graphene may serve as a clamping layer, which prevents disintegration of silicon particles while allowing for an alloying reaction between lithium ions and silicon (Si) to yield a very high specific capacity and provide a continuous conduction pathway between the particles.

The graphene layers may slide over each other when the silicon particles swell during lithiation, and then slide back to their relaxed positions during delithiation. Without being limited by theory, it is understood that this movement occurs because van der Waals forces are greater than the force of friction between the layers.

The clamping effect of the graphene layers, which prevents disintegration of silicon particles and allows the graphene layers to serve as a clamping layer, may be confirmed by evaluating whether the graphene layers remain the same (e.g., are unaffected) after about 200 times of repeated lithiation/delithiation cycles.

In some embodiments, the silicon-containing structure may include nanosized pores between closely compacted carbon flakes (such as graphene flakes) on the silicon composite primary particles, wherein the pores may serve as a buffer during volume expansion of the primary and secondary particles. An SEI layer may also be stably formed on the porous silicon composite primary particles through thermal treatment. The carbon (graphene) flakes on the silicon porous composite secondary particles may slide over one another, expanding their volume at the same time that volume expansion and contraction of silicon occurs, to thereby prevent the silicon composite primary particles from being exposed to the environment external to the secondary particles, and thus minimizes contact between the silicon composite primary particles and an electrolyte.

In accordance with an aspect of the disclosure, a silicon-containing structure (structure A) includes a carbonaceous coating layer on a silicon composite, the carbonaceous coating layer including amorphous carbon, as disclosed in US 2015/708255, the disclosure of which is incorporated herein in its entirety by reference.

The structure A of the prior art may be a silicon-containing composite structure including: a silicon composite having a porous core and a shell on the core, the core and the shell including the porous silicon secondary particle and a second graphene, respectively; and a carbonaceous coating layer on the silicon composite, the carbonaceous coating layer including amorphous carbon, wherein the porous silicon secondary particle includes an aggregate of silicon composite primary particles, the silicon composite primary particles include silicon, a silicon suboxide ($SiO_x$) (wherein $0<x<2$) on the silicon, and a first graphene on the silicon suboxide.

The first graphene and the second graphene disclosed herein may be construed as having substantially the same meaning as the first graphene and second graphene disclosed in US 2005/708255.

The above-described structure A of the prior art may be obtained by reaction with ethylene as a reaction gas at a temperature of, for example, about 900° C.

In the prior art silicon composite (structure A) including the carbonaceous coating layer, the graphene may have a structure of a flake, a nanosheet, a layer (or a film), or the like. The "nanosheet" refers to a structure of graphene disposed in an irregular manner on the silicon suboxide. The "layer" may refer to a continuous, uniform layered structure of graphene formed on the silicon suboxide. The graphene may have a structure including layers or may be without layers.

In accordance with another aspect of the disclosure, a carbon composite includes a silicon-containing structure according to any of the above-described embodiments and a carbonaceous material. A silicon-containing structure according to any of the embodiments may have a reduced specific surface area and an increased volume density (specific capacity), as compared with silicon composite primary particles, and thus may improve volume energy density and further reduce volume expansion of an electrode when mixed with a carbonaceous material. The carbon composite may further improve initial efficiency, specific capacity characteristics, rate capability, and durability of the lithium battery using the carbon composite, as compared to the silicon composite without the carbonaceous material.

In some embodiments, the carbonaceous material may include, for example, graphene, graphite, fullerene, carbon fibers, carbon nanotubes, or a combination thereof. For example, the amount of the carbonaceous material may be about 0.001 parts to about 99.999 parts by weight, or about 0.001 part by weight to about 99 parts by weight, and in some embodiments, about 10 parts to about 97 parts by weight, and in some other embodiments, about 50 parts to about 97 parts by weight, based on 100 parts by weight of the carbon composite. When the amount of the carbonaceous material of the carbon composite is within these ranges, a carbon composite with improved capacity and conductivity may be attained.

In some embodiments, the carbon composite may include graphite, and the silicon-containing structure may be disposed on the graphite.

The graphite may be, for example, SFG6 graphite (TIMREX®), and may have an average particle diameter of about 6 μm. When an electrode is formed using the carbon composite, an amount of the carbon composite in the electrode may be, for example, about 65 parts to 100 parts by weight, or about 65 parts to about 90 parts by weight, or from about 68 parts to about 87 parts by weight, and an amount of a binder may be, for example, about 10 parts to about 50 parts by weight, or about 12 parts to about 40 parts by weight, or from about 13 parts to about 32 parts by weight. For example, an amount of the graphite in the carbon composite may be, about 0.5 part to about 30 parts by weight, or about 1 part to about 25 parts by weight, or for example, 1 part to about 20 parts by weight based on 100 parts by weight of the carbon composite.

The binder may be, for example, lithium polyacrylate.

The compound represented by Formula 1 and the compound represented by Formula 2 may each independently be methane, ethylene, propylene, methanol, ethanol, propanol, or a combination thereof.

The first oxygen-containing compound represented by Formula 3 may include, for example, carbon dioxide ($CO_2$), carbon monoxide (CO), water vapor ($H_2O$), or a combination thereof.

The carbon source gas may further include an inert gas including nitrogen, helium, argon, or a combination thereof.

The oxygen-containing compound may include carbon monoxide, carbon dioxide, water vapor, or a combination thereof.

When the oxygen-containing gas is used as the carbon source gas, the silicon suboxide may be formed to have a greater thickness as compared with a thickness of a natural silicon oxide layer. For example, a thickness of the silicon suboxide may be selected to be about 10 nm or less, or about 7.5 nm or less, or about 5 nm or less, for example, from about 0.5 nm to about 5 nm. When the thickness of the silicon oxide is within these ranges, a shape and a thickness of the graphene may be appropriately controlled. In particular, when the silicon suboxide has a thickness larger than that of a natural silicon oxide layer, the graphene layer on the silicon suboxide may have a denser structure than a graphene nanosheet. The graphene layer may include, for example, 5 to 10 graphene layers.

When the gas mixture includes water vapor, conductivity of the silicon composite may further be improved. While not being limited to this theory, it is understood that since carbon having a high degree of crystallinity may be deposited on the silicon coated with the silicon suboxide by reaction with the gas mixture in the presence of water vapor, the carbon composite may have high conductivity even when coated with a small amount of carbon. The amount of water vapor in the gas mixture, though not specifically limited, may be, for example, in a range of about 0.01% by volume to about 10% by volume based on 100% by volume of the carbon source gas.

In some embodiments, the carbon source gas may be methane, a mixed gas of methane and an inert gas, an oxygen-containing compound, or a mixed gas of methane and an oxygen-containing compound. In some other embodiments, the carbon source gas may be a mixed gas of $CH_4$ and $CO_2$, or a mixed gas of $CH_4$, $CO_2$, and $H_2O$.

The mixed gas of $CH_4$ and $CO_2$ may be supplied at a molar ratio of about 1:0.20 to about 1:0.50, and in some embodiments, at a molar ratio of about 1:0.25 to about 1:0.45, and in some other embodiments, at a molar ratio of about 1:0.30 to about 1:0.40.

The mixed gas of $CH_4$, $CO_2$, and $H_2O$ may be supplied at a molar ratio of about 1:0.20 to 0.50:0.01 to 1.45, and in some embodiments, at a molar ratio of about 1:0.25 to 0.45:0.10 to 1.35, and in some other embodiments, at a molar ratio of about 1:0.30 to 0.40:0.50 to 1.0.

In some embodiments, the carbon source gas may be carbon monoxide (CO) or carbon dioxide ($CO_2$). In some other embodiments, the carbon source gas may be a mixed gas of $CH_4$ and $N_2$.

The mixed gas of $CH_4$ and $N_2$ may be supplied at a molar ratio of about 1:0.20 to about 1:0.50, and in some embodiments, at a molar ratio of about 1:0.25 to 1:0.45, and in some other embodiments, at a molar ratio of about 1:0.30 to about 1:0.40. In some embodiments, the carbon source gas may not include an inert gas such as nitrogen.

The thermal treatment may be performed at a temperature of about 750° C. to about 1,100° C., and in some embodiments, about 800° C. to about 1,000° C.

The thermal treatment may be performed at any pressure level without limitation. The pressure level for the thermal treatment may be appropriately selected in consideration of a thermal treatment temperature, composition of the gas mixture, and a target amount of coated carbon. The pressure level for the thermal treatment may be controlled by varying amounts of inflow and outflow of the gas mixture. For example, the pressure for the thermal treatment may be about 1 atmosphere (atm) or greater, and in some embodiments, about 2 atm or greater, about 3 atm or greater, about 4 atm or greater, or about 5 atm or greater. However, embodiments are not limited thereto.

The thermal treatment time may not be specifically limited, and may be appropriately controlled depending on the thermal treatment temperature, thermal treatment pressure, composition of the gas mixture, and target amount of coated carbon. For example, the thermal treatment time may be in a range of about 10 minutes to about 100 hours, and in some embodiments, may be in a range of about 30 minutes to about 90 hours, and in some other embodiments, may be in a range of about 50 minutes to about 40 hours. However, embodiments are not limited thereto. While not limited to theory, it is understood that the longer the thermal treatment time, the greater an amount of graphene (carbon) that may be deposited, and the better the electrical characteristics of the composite may become. However, these effects may not be directly proportional to the thermal treatment time. For example, deposition of graphene may stop or a deposition rate thereof may become low after a predetermined duration.

According to an embodiment, a method of preparing the silicon-containing structure according to the one or more embodiments may provide a uniform coating of graphene on the silicon covered with the silicon suboxide ($SiO_x$), even at a relatively low temperature, through a vapor phase reaction of the carbon source gas as described above. Separation of the graphene from the silicon covered with the silicon suboxide ($SiO_x$) may substantially not occur. When a thickness of the silicon suboxide is appropriately controlled, the separation of the graphene may be even further suppressed. In this regard, a thickness of the silicon suboxide that may efficiently suppress separation of the graphene is about 10 nm or less, for example, from about 0.1 nm to about 10 nm, for example, from about 0.1 nm to about 5 nm.

Since the graphene is coated on the silicon through a vapor phase reaction to form a coating layer, the coating layer may have a high degree of crystallinity. When the silicon-containing structure is used as a negative active material, the negative active material may have improved conductivity without a structural change.

A process of preparing a carbon composite using the silicon-containing structure composite structure according to the one or more embodiments may be as follows.

A silicon-containing structure according to an embodiment and a carbonaceous material may be mixed together and thermally treated.

The thermal treatment may be performed at a temperature of about 600° C. to about 1,100° C., for example, about 700° C. to about 1,000° C. When the thermal treatment temperature is within these ranges, a carbon composite with improved capacity characteristics may be attained.

In some embodiments, a silicon-containing structure, or a carbon composite including the silicon-containing structure, according to any of the above-described embodiments may be used in, for example, a battery, a field emission material for a display, a thermoelectric device, or a biosensor.

In accordance with another aspect of the disclosure, an electrode includes a silicon-containing structure or a carbon composite including the silicon-containing structure, according to any of the above-described embodiments. The electrode may be an electrode for a lithium battery. The electrode may be a negative electrode.

The silicon-containing structure or the carbon composite including the silicon-containing structure may be used as an electrode active material, for example, a negative active material. In this regard, when the silicon-containing structure or the carbon composite are used as a negative active material, volume expansion and disintegration of silicon may be reduced or prevented. The negative active material may have improved conductivity, and may improve high-rate characteristics of a battery. Moreover, since a small amount of graphene may be coated on the silicon covered with the silicon suboxide, the negative active material may have improved energy density per volume. A lithium battery may be provided which may include the silicon-containing structure or the carbon composite, the carbon composite including a silicon-containing structure according to any of the embodiments and a carbonaceous material.

In some embodiments, the negative electrode may be manufactured in the following manner.

The negative electrode may be formed by molding, into a predetermined shape, a negative active material composition which may include, for example, a silicon-containing structure or a carbon composite as a negative active material, a conducting agent, and a binder, or the negative electrode may be formed by coating the negative active material composition on a current collector, such as a copper (Cu) foil. Also, the negative active material composition may not include a conducting agent.

In some embodiments, the negative active material composition may be formed as a film on a separator without the current collector.

In particular, the negative active material composition may be prepared by mixing the negative active material, a conducting agent, a binder, and a solvent. The negative active material composition may be directly coated on a metal current collector to form a negative electrode plate. In some embodiments, the negative active material composition may be cast onto a separate support to form a negative active material film. The negative active material film may be separated from the support and then laminated on a metal current collector to thereby form a negative electrode. The negative electrode is not limited to the above-listed forms, and may have any of a variety of forms.

The negative active material composition may further include a carbonaceous negative active material, in addition to the above-described negative active material. For example, the carbonaceous negative active material may be include natural graphite, artificial graphite, expanded graphite, graphene, carbon black, fullerene soot, carbon nanotubes, graphitic carbon, carbon fibers, or a combination thereof. However, embodiments are not limited thereto. Any suitable carbonaceous negative active material available in the art may be used.

The conducting agent may be acetylene black, Ketjen black, natural graphite, artificial graphite, carbon black, carbon fibers, or a metal powder or metal fibers of copper, nickel, aluminum, or silver. The conducting agent may include one or more conductive materials, such as a polyphenylene derivative, in combination. However, embodiments are not limited thereto. Any suitable conducting agent may be used.

The binder may be a vinylidene fluoride/hexafluoropropylene copolymer, polyvinylidenefluoride (PVDF), polyacrylonitrile, polymethylmethacrylate, polytetrafluoroethylene, a styrene-butadiene rubber-based polymer, polyacrylic acid, polyamide imide, polyimide, or a combination thereof. However, embodiments are not limited thereto. Any suitable binder may be used.

The solvent may be N-methylpyrrolidone, acetone, or water. However, embodiments are not limited thereto. Any suitable solvent may be used.

The amounts of the negative active material, the conducting agent, the binder, and the solvent may be the same as those used in lithium batteries, and may be determined by those of skill in the art without undue experimentation. At least one of the conducting agent, the binder, and the solvent may be omitted depending on a use and a structure of a lithium battery.

In some embodiments, a lithium battery may include the negative electrode. The lithium battery may be manufactured in the following manner.

First, a negative electrode may be manufactured according to the above-described method of manufacturing a negative electrode.

Next, a positive active material composition may be prepared by mixing a positive active material, a conducting agent, a binder, and a solvent. The positive active material composition may be directly coated on a metal current collector and dried to manufacture a positive electrode. In some other embodiments, the positive active material composition may be cast on a separate support to form a positive active material film. The positive active material film may then be separated from the support and then laminated on a metal current collector, to thereby manufacture a positive electrode.

The positive active material may include lithium cobalt oxide, lithium nickel cobalt manganese oxide, lithium nickel cobalt aluminum oxide, lithium iron phosphate, lithium manganese oxide, or a combination thereof. However, embodiments are not limited thereto. Any positive active materials may be used.

For example, the positive active material may be a lithium-containing metal oxide. Any suitable positive active material commonly used in the art may be used. For example, the positive active material may be a composite lithium oxide including cobalt (Co), manganese (Mn), nickel (Ni), or a combination thereof. For example, the positive active material may be a compound represented by one of the following formulae: $Li_aA_{1-b}B_bD_2$ (wherein $0.90 \le a \le 1$, and $0 \le b \le 0.5$); $Li_aE_{1-b}B_bO_{2-c}D_c$ (wherein $0.90 \le a \le 1$, $0 \leq b \leq 0.5$, and $0 \leq c \leq 0.05$); $LiE_{2-b}B_bO_{4-c}D_c$ (wherein $0 \leq b \leq 0.5$, and $0 \leq c \leq 0.05$); $Li_aNi_{1-b-c}Co_bB_cD_\alpha$ (wherein $0.90 \leq a \leq 1$, $0 \leq b \leq 0.5$, $0 \leq c \leq 0.05$, and $0 < \alpha \leq 2$); $Li_aNi_{1-b-c}Co_bB_cO_{2-\alpha}F_\alpha$ (wherein $0.90 \leq a \leq 1$, $0 \leq b \leq 0.5$, $0 \leq c \leq 0.05$, and $0 < \alpha < 2$); $Li_aNi_{1-b-c}Co_bB_cO_{2-\alpha}F_2$ (wherein $0.90 \leq a \leq 1$, $0 \leq b \leq 0.5$, $0 \leq c \leq 0.05$, and $0 < \alpha < 2$); $Li_aNi_{1-b-c}Mn_bB_cD_\alpha$ (wherein $0.90 \leq a \leq 1$, $0 \leq b \leq 0.5$, $0 \leq c \leq 0.05$, and $0 < \alpha \leq 2$); $Li_aNi_{1-b-c}Mn_bB_cO_{2-\alpha}F_\alpha$ (wherein $0.90 \leq a \leq 1$, $0 \leq b \leq 0.5$, $0 \leq c \leq 0.05$, and $0 < \alpha < 2$); $Li_aNi_{1-b-c}Mn_bB_cO_{2-\alpha}F_2$ (wherein $0.90 \leq a \leq 1$, $0 \leq b \leq 0.5$, $0 \leq c \leq 0.05$, and $0 < \alpha < 2$); $Li_aNi_bE_cG_dO_2$ (wherein $0.90 \leq a \leq 1$, $0 \leq b \leq 0.9$, $0 \leq c \leq 0.5$, and $0.001 \leq d \leq 0.1$); $Li_aNi_bCo_cMn_dGeO_2$ (wherein $0.90 \leq a \leq 1$, $0 \leq b \leq 0.9$, $0 \leq c \leq 0.5$, $0 \leq d \leq 0.5$, and $0.001 \leq e \leq 0.1$); $Li_aNiG_bO_2$ (wherein $0.90 \leq a \leq 1$, and $0.001 \leq b \leq 0.1$); $Li_aCoG_bO_2$ (wherein $0.90 \leq a \leq 1$, and $0.001 \leq b \leq 0.1$); $Li_aMnG_bO_2$ (wherein $0.90 \leq a \leq 1$, and $0.001 \leq b \leq 0.1$); $Li_aMn_2G_bO_4$ (wherein $0.90 \leq a \leq 1$, and $0.001 \leq b \leq 0.1$); $QO_2$; $QS_2$; $LiQS_2$; $V_2O_5$; $LiV_2O_5$; $LiIO_2$; $LiNiVO_4$; $Li_{(3-f)}J_2(PO_4)_3$ (wherein $0 \leq f \leq 2$); $Li_{(3-f)}Fe_2(PO_4)_3$ (wherein $0 \leq f \leq 2$); and $LiFePO_4$. A combination comprising at least one of the foregoing may also be used.

In the formulae above, A may be nickel (Ni), cobalt (Co), manganese (Mn), or a combination thereof; B may be aluminum (Al), nickel (Ni), cobalt (Co), manganese (Mn), chromium (Cr), iron (Fe), magnesium (Mg), strontium (Sr), vanadium (V), a rare earth element, or a combination thereof; D may be oxygen (O), fluorine (F), sulfur (S), phosphorus (P), or a combination thereof; E may be cobalt (Co), manganese (Mn), or a combination thereof; F may be fluorine (F), sulfur (S), phosphorus (P), or a combination thereof; G may be aluminum (Al), chromium (Cr), manganese (Mn), iron (Fe), magnesium (Mg), lanthanum (La), cerium (Ce), strontium (Sr), vanadium (V), or a combination thereof; Q may be titanium (Ti), molybdenum (Mo), manganese (Mn), or a combination thereof; I may be chromium (Cr), vanadium (V), iron (Fe), scandium (Sc), yttrium (Y), or a combination thereof; and J may be vanadium (V), chromium (Cr), manganese (Mn), cobalt (Co), nickel (Ni), copper (Cu), or a combination thereof.

The compounds listed above as positive active materials may have a surface coating layer (hereinafter, "coating layer"). Alternatively, a mixture of a compound without a coating layer and a compound having a coating layer, the compounds being selected from the compounds listed above, may be used. The coating layer may include an oxide, a hydroxide, an oxyhydroxide, an oxycarbonate, a hydroxycarbonate of a coating element. The compounds for the coating layer may be amorphous or crystalline. The coating element for the coating layer may be magnesium (Mg), aluminum (Al), cobalt (Co), potassium (K), sodium (Na), calcium (Ca), silicon (Si), titanium (Ti), vanadium (V), tin (Sn), germanium (Ge), gallium (Ga), boron (B), arsenic (As), zirconium (Zr), or a combination thereof. The coating layer may be formed by any method that does not adversely affect the physical properties of the positive active material when a compound is used as the coating element, for example, by a spray coating method, a dipping method, or the like. This will be understood by those of skill in the art, and thus a detailed description thereof is omitted.

For example, the positive active material may be $LiNiO_2$, $LiCoO_2$, $LiMn_xO_{2x}$ (wherein x may be 1 or 2), $LiNi_{1-x}Mn_xO_2$ (wherein $0 < x < 1$), $LiNi_{1-x-y}Co_xMn_yO_2$ (wherein $0 \leq x \leq 0.5$ and $0 \leq y \leq 0.5$), $LiFeO_2$, $V_2O_5$, TiS, MoS, or a combination thereof.

The conducting agent, the binder, and the solvent used in the positive active material composition may be the same as those used in the negative active material composition described above. In some embodiments, a plasticizer may further be added to the positive active material composition and/or the negative active material composition to obtain an electrode including pores.

The amounts of the positive active material, the conducting agent, the binder, and the solvent may be the same as those commonly used in lithium batteries and may be determined by the person of skill in the art without undue experimentation. At least one of the conducting agent, the binder, and the solvent may be omitted depending on the use and structure of a lithium battery.

Next, a separator to be disposed between the positive electrode and the negative electrode may be prepared. The separator may be any separator suitable for use in lithium batteries. In some embodiments, the separator may have low resistance to migration of ions in an electrolyte and have a good electrolyte-retaining ability. For example, the separator may be selected from glass fiber, polyester, Teflon, polyethylene, polypropylene, polytetrafluoroethylene (PTFE), and combinations thereof, each of which may be a non-woven or woven fabric. For example, a rollable separator including polyethylene or polypropylene may be used in a lithium ion battery. A separator with a good organic electrolytic solution-retaining ability may be used in a lithium ion polymer battery. For example, the separator may be manufactured in the following manner.

In some embodiments, a polymer resin, a filler, and a solvent may be mixed together to prepare a separator composition. Then, the separator composition may be directly coated on a support and then dried to thereby form the separator. In some other embodiments, the separator composition may be cast on a support and dried to form a separator film. The separator film may be separated from the support and laminated on an electrode to thereby form the separator.

The polymer resin used to manufacture the separator may be any material suitably used as a binder for electrode plates. For example, the polymer resin may be a vinylidene fluoride/hexafluoropropylene copolymer, PVDF, polyacrylonitrile, polymethylmethacrylate, or a combination thereof.

The separator may include a ceramic composition to improve the separator functioning as a membrane. For example, the separator may be coated with an oxide or may be formed to include ceramic particles.

Next, an electrolyte may be prepared.

For example, the electrolyte may be an organic electrolyte. The electrolyte may be solid. For example, the electrolyte may be a boron oxide or a lithium oxynitride. However, embodiments are not limited thereto. Any suitable solid electrolyte may be used. The solid electrolyte may be formed on the negative electrode by a method, for example, by sputtering.

For example, an organic electrolyte may be prepared. The organic electrolyte may be prepared by dissolving a lithium salt in an organic solvent.

The organic solvent may be any suitable organic solvent. For example, the organic solvent may be propylene carbonate, ethylene carbonate, fluoroethylene carbonate, butylene carbonate, dimethyl carbonate, diethyl carbonate, methylethyl carbonate, methylpropyl carbonate, ethylpropyl carbonate, methylisopropyl carbonate, dipropyl carbonate, dibutyl carbonate, chloroethylene carbonate, benzonitrile, acetonitrile, tetrahydrofuran, 2-methyltetrahydrofuran, γ-butyrolactone, dioxolane, 4-methyldioxorane, N,N-dimethyl formamide, dimethyl acetamide, N,N-dimethylsulfoxide, dioxane, 1,2-dimethoxyethane, sulfolane, dichloroethane, chlorobenzene, nitrobenzene, diethylene glycol, dimethyl ether, or a combination thereof.

The lithium salt may be any suitable lithium salt. For example, the lithium salt may be $LiPF_6$, $LiBF_4$, $LiSbF_6$, $LiAsF_6$, $LiClO_4$, $LiCF_3SO_3$, $Li(CF_3SO_2)_2N$, $Li(FSO_2)_2N$, $LiC_4F_9SO_3$, $LiAlO_2$, $LiAlCl_4$, $LiN(C_xF_{2x+1}SO_2)(C_yF_{2y+1}SO_2)$ (wherein x and y may be natural numbers), LiCl, LiI, or a combination thereof.

Figure 14:
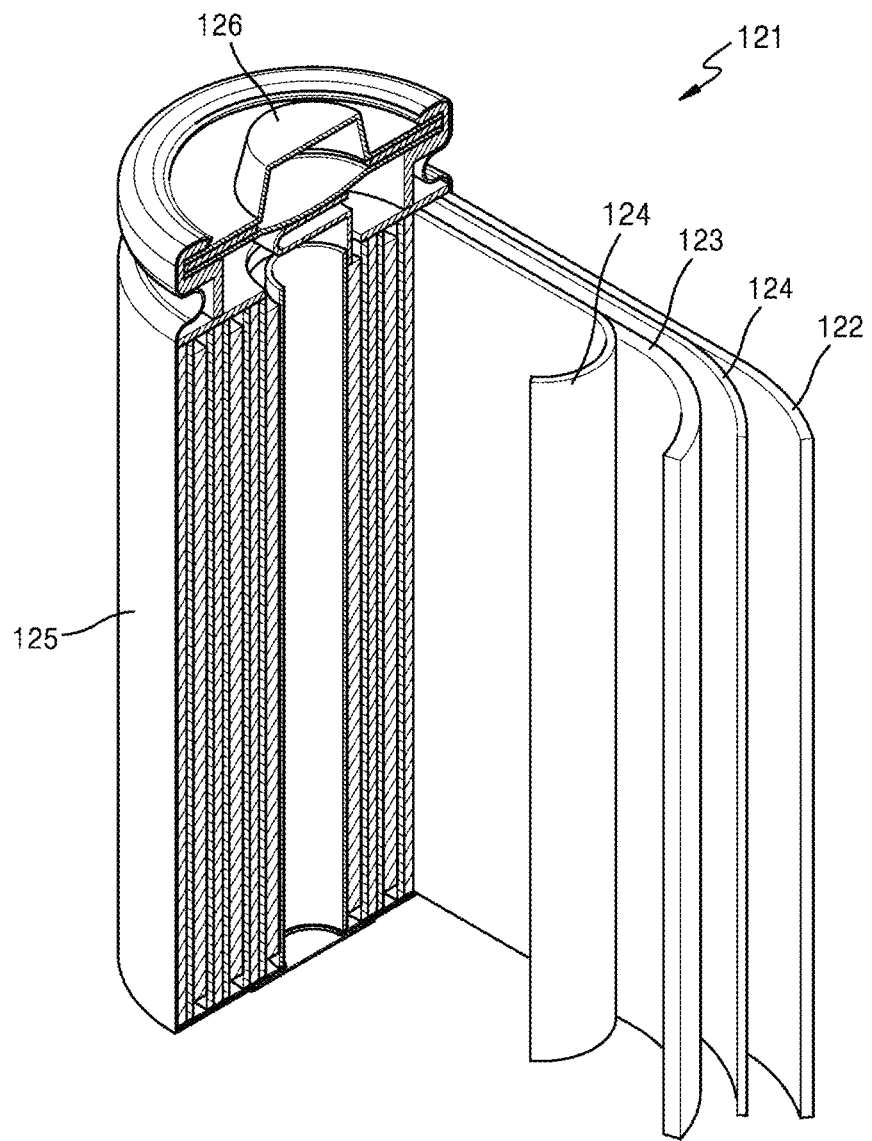
FIG. 14 is a schematic view of a lithium battery according to an embodiment.

Referring to FIG. 14, a lithium battery 121 according to an embodiment may include a positive electrode 123, a negative electrode 122, and a separator 124. The positive electrode 123, the negative electrode 122, and the separator 124 may be wound or folded, and then housed in a battery case 125. Then, the battery case 125 may be filled with an organic liquid electrolyte and sealed with a cap assembly 126, thereby completing the manufacture of the lithium battery 121. The battery case 125 may be a cylindrical type, a rectangular type, or a thin-film type. For example, the lithium battery 121 may be a thin-film type battery. For example, the lithium battery 121 may be a lithium ion battery.

The separator 124 may be interposed between the positive electrode 123 and the negative electrode 122 to form a battery assembly. A plurality of such battery assemblies may be stacked in a bi-cell structure and impregnated with an organic electrolyte solution. The resultant battery assembly may then be put into a pouch and hermetically sealed to thereby complete the manufacture of a lithium ion battery.

In some embodiments, a plurality of battery assemblies may be stacked upon one another to form a battery pack, which may be used in any device that requires high capacity and high output, for example, in a laptop computer, a smartphone, an electric vehicle, and the like.

A lithium battery including such a battery pack may have improved high-rate characteristics and lifetime characteristics, and thus may be applicable in an electric vehicle (EV), for example, in a hybrid vehicle such as a plug-in hybrid electric vehicle (PHEV).

In accordance with another aspect of the disclosure, a field emission device includes a silicon-containing structure according to any of the embodiments, or a carbon composite including a silicon-containing structure according to any of the embodiments and a carbonaceous material.

A field emission device is a device which is based upon the migration of electrons. In general, a field emission device may include, at least, a reduction electrode, an emitter tip, and an oxidation electrode separated from the reduction electrode. Examples of such a field emission device are disclosed in U.S. Pat. Nos. 7,009,331; 6,976,897; 6,911,767; and US 2006/0066217, the disclosures of which are incorporated in their entirety by reference. The emitter tip may emit electrons as a voltage is applied between the reduction electrode and the oxidation electrode. The electrons may migrate from the reduction electrode toward the oxidation electrode. A field emission device according to an embodiment of the present disclosure may be used for various purposes, for example, in ultrasonic vacuum tube equipment (for example, an X-ray tube), a power amplifier, an ion gun, a high-energy accelerator, a free-electron laser, an electron microscope, and specifically, in a flat display device. A flat display device may be used as an alternative to a common cathode tube, and may also be applicable in a TV or a computer monitor.

A silicon-containing structure according to any of the embodiments or a carbon composite including the same may be used as the emitter tip.

A common emitter tip may be manufactured using a metal such as molybdenum (Mo) or a semiconductor such as silicon. One of the concerns with using the metal emitter is a comparatively high control voltage of about 100 volts (V) required for emission. In addition, due to nonuniformity of such common emitter tips, current densities of individual pixels of a field emission device using the common emitter tips may be nonuniform.

When a silicon-containing structure or carbon composite according to any of the above-described embodiments is used as the emitter tip, the field emission device may have improved field emission characteristics.

A silicon-containing structure or carbon composite according to any of the embodiments may be used to manufacture an electroluminescent device.

According to another aspect of the present disclosure, a biosensor includes a silicon-containing structure according to any of the above-described embodiments, or a carbon composite including the silicon-containing structure and a carbonaceous material.

The silicon-containing structure or carbon composite according to any of the embodiments may be used to form an electrode for a biosensor.

Figure 18:
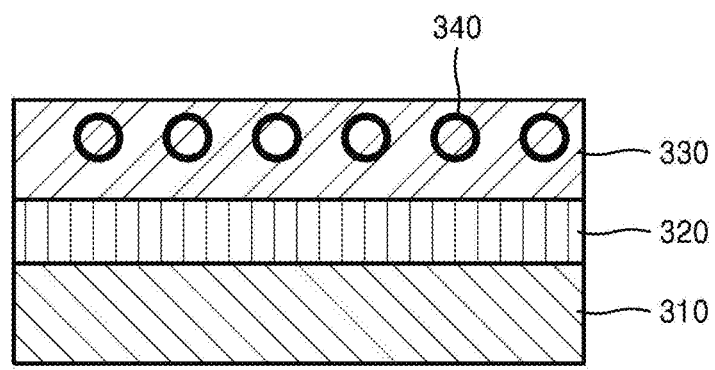
FIG. 18 is an illustration of a structure of an electrode of a biosensor, according to an embodiment.

FIG. 18 is a schematic cross-sectional view illustrating a structure of an electrode of a biosensor according to an embodiment of the present disclosure.

Referring to FIG. 18, the electrode of a biosensor may include a substrate 310, a first layer 320 on the substrate 310, the first layer 320 including a silicon-containing structure or carbon composite according to any of the embodiments, and a second layer 330 on the first layer 320. A biomaterial 340 may be supported by, or fixed in, the second layer 330 in a variety of manners.

The substrate 310 may be any plate on which graphene may be deposited or formed, and for example, may be glass, plastic, metal, ceramic, silicon, or a combination thereof. A type of the substrate 310 is not specifically limited, provided that graphene may be deposited or formed thereon.

The biomaterial 340 may include enzymes, aptamers, proteins, nucleic acids, microorganisms, cells, lipids, hormones, DNA, PNA, RNA, or a combination thereof. Any of various biomaterials, not stated herein, may also be used.

Referring to FIG. 18, in the electrode of a biosensor, the biomaterial 340 may be an enzyme, and the first layer 320 may be a layer able to support the enzyme or have the enzyme fixed therein. Although according to FIG. 18 an enzyme as the biomaterial 340 appears as being supported by or fixed in the second layer 330, the location of the enzyme is not limited thereto, and the enzyme may partially or entirely protrude through a surface of the second layer 330 and be exposed. When a biosensor has this structure including an enzyme with substrate specificity to selectively respond to a target molecule in a mixture, the biosensor may selectively sense an analyte (for example, blood sugar) to which the enzyme responds.

According to another aspect of the present disclosure, a semiconductor device includes a silicon-containing structure according to any of the above-described embodiments, or a carbon composite including a silicon-containing structure according to any of the above-described embodiments and a carbonaceous material.

The silicon-containing structure or the carbon composite may be used as an electrode of the semiconductor device.

According to another aspect of the present disclosure, there are provided a thermoelectric material and a thermoelectric device, each including a silicon-containing structure according to any of the above-described embodiments, or a carbon composite including a silicon-containing structure according to any of the above-described embodiments and a carbonaceous material.

The thermoelectric material may have good electrical characteristics, and consequently may have improved thermoelectric performance. The thermoelectric material may be used in a thermoelectric device, a thermoelectric module, or a thermoelectric system.

The performance of the thermoelectric material is evaluated using a dimensionless figure of merit (ZT), which is defined by Equation 2.

$$ZT=(S^2\sigma T)/k \qquad \text{Equation 2}$$

In Equation 2, ZT is a figure of merit, S is a Seebeck coefficient, σ is electrical conductivity, T is an absolute temperature, and k is thermal conductivity.

As represented in Equation 2, an increased ZT value of a thermoelectric material may be obtained by increasing the Seebeck coefficient (S) and the electrical conductivity (σ) of the thermoelectric material, i.e., a power factor ($S^2\sigma$), and reducing the thermal conductivity (k) of the thermoelectric material.

A silicon-containing structure or carbon composite according to any of the above-described embodiments may include graphene, and thus provide high electrical conductivity and low thermal conductivity to a thermoelectric material when included therein, according to the characteristics of the graphene, and improve performance of the thermoelectric material.

In a silicon-containing structure or carbon composite according to any of the above-described embodiments, crystalline characteristics and an electron structure may be changed at an interface between the metallic graphene and semi-conductive silicon to increase a Seebeck coefficient thereof and accelerate transfer of charge particles, which may consequently induce an increase in electrical conductivity and charge mobility. In addition, phonon scattering at the interface between the graphene and the silicon may be increased such that it may be possible to control the thermal conductivity of the thermoelectric material.

Such a silicon-containing structure or carbon composite according to any of the above-described embodiments may be effectively used as a thermoelectric material. A thermoelectric device may be manufactured by processing the thermoelectric material into a shape, for example, by cutting. The thermoelectric device may be a p-type thermoelectric device. The thermoelectric device may be a structure formed by shaping the thermoelectric material in a predetermined shape, for example, in a rectangular parallelepiped shape.

The thermoelectric device may have a cooling effect when it is combined with an electrode and a current is applied thereto, and may have a power generation effect based on a temperature difference.

Figure 15:
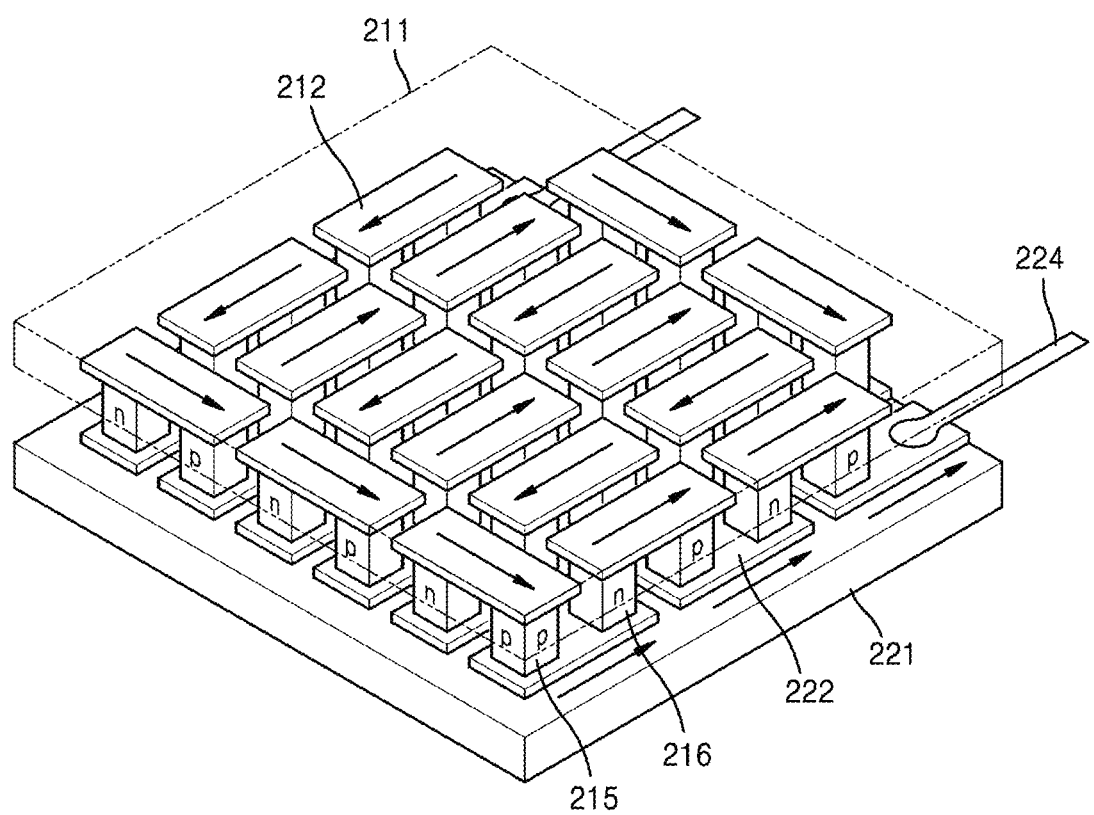
FIG. 15 is a schematic view of a thermoelectric module according to an embodiment.

FIG. 15 is a schematic view of a thermoelectric module using a thermoelectric device according to an embodiment of the present disclosure. Referring to FIG. 15, an upper electrode (first electrode) 212 and a lower electrode (second electrode) 222 are patterned on an upper insulating substrate 211 and a lower insulating substrate 221, respectively. The upper electrode 212 and the lower electrode 222 may contact a p-type thermoelectric component 215 and an n-type thermoelectric component 216. The upper electrode 212 and the lower electrode 222 may be connected to the outside of the thermoelectric device by a lead electrode 224. The p-type thermoelectric component 215 may be a thermoelectric device according to any of the above-described embodiments. The n-type thermoelectric component 216 may not be specifically limited, and may be any suitable material in the art.

The upper and lower insulating substrates 211 and 221 may include gallium arsenic (GaAs), sapphire, silicon, Pyrex, or quartz. The upper and lower electrodes 212 and 222 may include, for example, copper, aluminum, nickel, gold, or titanium, and may have various sizes. The upper and lower electrodes 212 and 222 may be formed using any patterning method, for example, a lift-off semiconductor process, a deposition method, or a photolithography technique.

Figure 16:
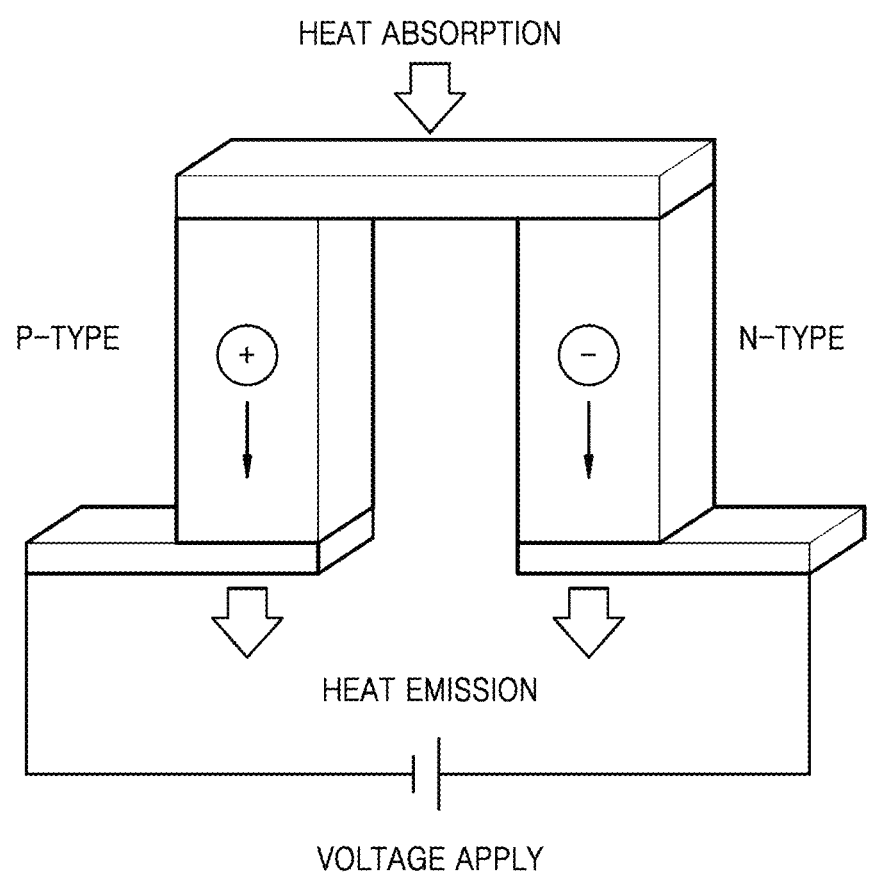
FIG. 16 is a schematic diagram illustrating a thermoelectric cooler having a design using the Peltier effect.
Figure 17:
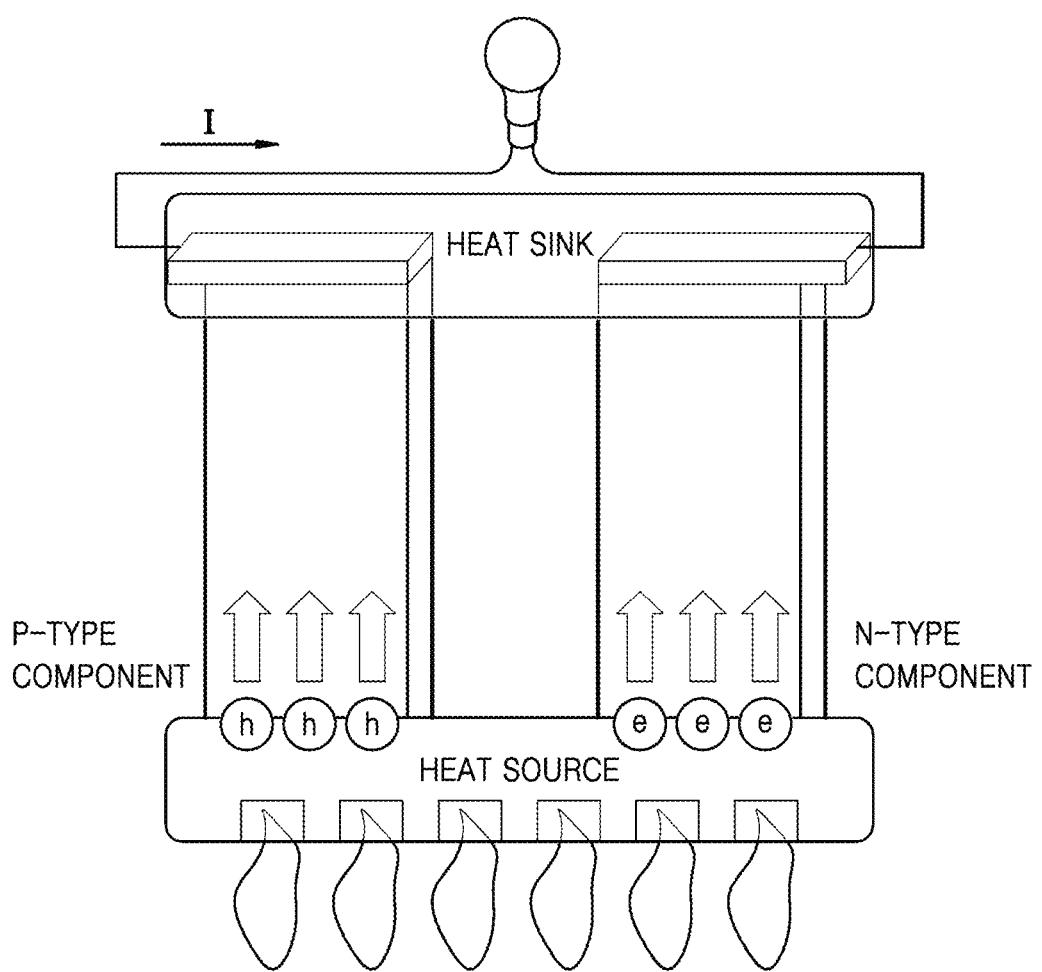
FIG. 17 is a schematic diagram illustrating a thermoelectric generator having a design using the Seebeck effect.

In some embodiments, one of the first and second electrodes 212 and 222 in the thermoelectric module may be exposed to a heat source as illustrated in FIGS. 16 and 17. In some other embodiments, one of the first and second electrodes 212 and 222 in the thermoelectric module may be electrically connected to a power supply source, or to the outside of the thermoelectric module, for example, to an electric device (for example, a battery) that consumes or stores electric power.

In some embodiments, one of the first and second electrodes 212 and 222 in the thermoelectric module may be electrically connected to a power supply source.

One or more embodiments of the present disclosure will now be described in detail with reference to the following examples. However, these examples are only for illustrative purposes and are not intended to limit the scope of the one or more embodiments of the present disclosure.

Preparation Example 1: Silicon Composite

Needle-like silicon was pulverized to obtain plate-shaped and needle-like (e.g., needle-shaped) silicon particles having a silicon suboxide ($SiO_x$, wherein 0<x<2) layer (having a thickness of about 0.1 nm) on a surface thereof, a length of about 125 nm, and a thickness of about 40 nm.

A composition including 25 parts by weight of the plate- and needle-like silicon particles, 10 parts by weight of stearic acid, and 65 parts by weight of isopropyl alcohol was sprayed, and then dried (e.g., spray-dried) to obtain porous silicon secondary particles having an average particle diameter of about 5 μm.

The spray-drying was performed using a spray drier (MMSD Micro Mist Spray Dryers, Fujisaki Electric). The spray nozzle size, pressure under a $N_2$ atmosphere, and powder spray atmosphere temperature (about 200° C.) were controlled, and the sprayed resultant was dried under these conditions to remove isopropyl alcohol and thereby prepare porous silicon secondary particles. The spray nozzle size was controlled to about 5 μm, and the spray nozzle was about 0.5 MPa.

The porous silicon secondary particles were loaded into a reactor. A gas including methane ($CH_4$, 300 standard cubic centimeters per minute (sccm)) was supplied into the reactor to create an atmosphere of the gas. A pressure level inside the reactor resulting from the supply of the gas was 1 atm. The internal temperature of the reactor was increased to 1,000° C. (at a rate of about 23° C. per minute) under the atmosphere of the gas, and while the gas was continuously supplied into the reactor, thermal treatment was performed at 1,000° C. for about 1 hour. The resulting product was left for about 4 hours. Then, the supply of the gas was stopped, and the reactor was cooled down to room temperature (25° C.), thereby obtaining a porous silicon composite including porous silicon secondary particles and highly crystalline second graphene flakes on the porous silicon secondary particles, the porous silicon secondary particles each including an aggregate of two or more silicon composite primary particles each including silicon, a silicon suboxide ($SiO_x$, where 0<x<2) on the silicon, and first graphene flakes on the silicon suboxide.

A total amount of the first graphene flakes and the second graphene flakes in the silicon composite was about 25 parts by weight based on 100 parts by weight of a total weight of the silicon composite.

Preparation Example 2: Silicon Composite

A silicon composite was prepared in the same manner as in Preparation Example 1, except that the thermal treatment conditions were controlled to obtain a porous silicon composite including first and second graphite flakes, instead of the first and second graphene flakes, in the silicon composite and thermal treatment was performed at 900° C. for about 180 minutes.

Example 1: Silicon-Containing Structure

After 57 parts by weight of the silicon composite prepared in Preparation Example 1 was put into a planetary mixer, and 32 parts by weight of coal tar pitch and 12 parts by weight of N-methylpyrrolidone as an additive were added thereto, mixing was performed to infiltrate the coal tar pitch within pores of the silicon composite. The planetary mixer used was a revolution and rotation type centrifugal mixer without a structure such as a rotor or a ball. The mixing for infiltration of the coal tar pitch was performed in the order of agitating for 5 minutes, degassing for 5 minutes, and agitating for 5 minutes, i.e., about 15 minutes in total. This cycle was repeated four times. The agitating step was performed at a revolution speed of about 1,000 rotations per minute (rpm) and a rotation speed of about 1,000 rpm, and the degassing step was performed at a revolution speed of about 2,000 rpm and a rotation speed of about 64 rpm. 32 parts by weight of the coal tar pitch was divided into portions, with one portion added per cycle. The temperature was controlled to about 70° C.

Subsequently, the resulting composition was thermally treated under a nitrogen gas atmosphere at about 1,000° C. for about 3 hours, thereby preparing a silicon-containing structure including a second amorphous carbon in the silicon composite and a first amorphous carbon in a carbonaceous coating layer formed on the silicon composite. A carbon ratio of the first amorphous carbon to the second amorphous carbon was about 1:2 by weight.

In the silicon-containing structure obtained according to Example 1, a carbon ratio of the graphene flakes to the carbonaceous coating layer was about 2:8 by weight. The graphene flakes collectively refer to the first graphene flake and the second graphene flake. In the silicon-containing structure obtained according to Example 1, a weight ratio of the first amorphous carbon and the second amorphous carbon in 1:1.9.

Example 2: Silicon-Containing Structure

A silicon-containing structure was prepared in the same manner as in Example 1, except that the carbon ratio of the graphene flakes to the carbonaceous coating layer in the silicon-containing structure of Example 1 was changed to be about 5.5:4.5 by weight.

Comparative Example 1

Silicon primary particles were stacked three-dimensionally to form macro-sized silicon secondary particles having a size of about 5 μm, thereby obtaining a silicon secondary aggregate including only silicon.

Comparative Example 2

A Si/C porous structure was prepared according to the following procedure.

20 parts by weight of porous silicon, 20 parts by weight of graphite, 40 parts by weight of coal tar pitch, and 20 parts by weight of N-methylpyrrolidone were mixed to obtain a composition. The composition was mixed with isopropyl alcohol, spray-dried, and then dried to obtain Si/C porous structure particles having an average particle diameter of about 5-8 μm. The spray drying was performed using a spray drier (Model name: MMSD Micro Mist Spray Dryers, available from Fujisaki Electric). The spray nozzle size, the pressure under a $N_2$ atmosphere, and the powder spray temperature (about 200° C.) were controlled so as to remove the isopropyl alcohol by drying, thereby preparing the Si/carbon porous structure. The Si/C porous structure included pores with a porosity of about 55%.

Comparative Example 3

A silicon-containing structure was prepared in the same manner as in Example 1, except that 64 parts by weight of the silicon composite prepared in Preparation Example 1 and 36 parts by weight of the coal tar pitch were added to the planetary mixer, and dry milling was performed.

According to Comparative Example 3, it was difficult to form the carbonaceous coating layer including carbon on the silicon composite due to aggregation of the coal tar pitch, and it was difficult to fill the pores of the silicon composite with carbon.

Manufacturing Example 1: Manufacture of Negative Electrode and Coin Full Cell

The silicon-containing structure of Example 1, graphite, carbon black (KB600JD), lithium-substituted polyacrylate (Li-PAA), and N-methylpyrrolidone (NMP) as a solvent were mixed to prepare a slurry. A ratio of a mixture of the silicon-containing structure of Example 1 and graphite, carbon black (KB600JD), and lithium-substituted polyacrylate in the slurry was about 91:1:8 by weight on a solid basis. A ratio of the silicon-containing structure of Example 1 to graphite in the mixture was about 7:84 (1:12) by weight.

The slurry was applied to a copper (Cu) foil using a doctor blade to form a film having a thickness of about 40 μm, and the film was vacuum-dried at about 120° C. for about 2 hours and roll-pressed, thereby manufacturing a negative electrode.

A positive electrode was manufactured using a slurry obtained by mixing $LiNi_{0.6}Co_{0.2}Mn_{0.2}O_2$ and $LiNi_{0.8}Co_{0.15}Al_{0.5}O_2$ as positive active materials, carbon black (Super P™), lithium-substituted polyacrylate (Li-PAA) as a binder, and NMP as a solvent. A ratio of the positive active materials, Super P, and Li-PAA as a binder in the slurry was about 93:5:2 by weight. A ratio of the positive active materials $LiNi_{0.6}Co_{0.2}Mn_{0.2}O_2$ and $LiNi_{0.8}Co_{0.15}Al_{0.5}O_2$ was about 1:1 by weight. The slurry was applied to an aluminum (Al) foil using a doctor blade to form a film having a thickness of about 40 μm. The film was vacuum-dried at about 120° C. for about 2 hours and roll-pressed, thereby manufacturing the positive electrode.

A coin full cell was manufactured using the negative electrode and the positive electrode. A polypropylene membrane (Celgard 3510) was used as a separator. An electrolyte used was a liquid electrolyte obtained by mixing 1.3 molar (M) $LiPF_6$ in a mixed solvent of ethylene carbonate (EC), diethyl carbonate (DEC), and fluoroethylene carbonate (FEC) in a volume ratio of about 5:70:25, and adding vinylene carbonate (VC) and LiFSI. The amounts of VC and LiFSI were about 1.5 wt % and about 0.2 wt %, respectively, based on a total weight of the electrolyte.

Manufacturing Example 2: Manufacture of Negative Electrode and Coin Full Cell

A negative electrode and a coin full cell were manufactured in the same manner as in Manufacturing Example 1, except that the silicon-containing structure of Example 2 was used instead of the silicon-containing structure of Example 1.

Manufacturing Example 3: Manufacture of Negative Electrode and Coin Full Cell

A negative electrode and a coin full cell were manufactured in the same manner as in Manufacturing Example 1, except that a liquid electrolyte prepared in the following manner was used.

The liquid electrolyte was prepared by mixing 1.3 M $LiPF_6$ and a mixed solvent of FEC, EC, ethyl methyl carbonate (EMC), and dimethyl carbonate (DMC) in a volume ratio of about 7:7:46:40 and adding vinylene carbonate (VC) and LiFSI. The amount of the vinylene carbonate was about 1.5 wt %, and the amount of LiFSI was about 0.2 wt %, each based on a total weight of the electrolyte.

Manufacturing Example 4: Manufacture of Negative Electrode and Coin Half Cell

A negative electrode and a coin half cell were manufactured in the same manner as in Manufacturing Example 1, except that a lithium metal was used as a counter electrode, instead of the positive electrode.

Manufacturing Example 5: Manufacture of Negative Electrode and Coin Half Cell

A negative electrode and a coin half cell were manufactured in the same manner as in Manufacturing Example 3, except that a lithium metal was used as a counter electrode, instead of the positive electrode.

Comparative Manufacturing Example 1: Manufacture of Negative Electrode and Coin Full Cell A negative electrode and a coin full cell were manufactured in the same manner as in Manufacturing Example 1, except that the secondary aggregate of Comparative Example 1 was used instead of the silicon-containing structure of Example 1.

Comparative Manufacturing Example 2: Manufacture of Negative Electrode and Coin Full Cell A negative electrode and a coin full cell were manufactured in the same manner as in Manufacturing Example 1, except that the Si/carbon porous structure of Comparative Example 2 was used instead of the silicon-containing structure of Example 1.

Comparative Manufacturing Example 3: Manufacture of Negative Electrode and Coin Full Cell A negative electrode and a coin full cell were manufactured in the same manner as in Manufacturing Example 1, except that the silicon-containing structure of Comparative Example 3 was used instead of the silicon-containing structure of Example 1.

Comparative Manufacturing Examples 4 and 5: Manufacture of Negative Electrode and Coin Half Cell Negative electrode and coin half cell were manufactured in the same manner as in Manufacturing Example 4, except that the silicon secondary aggregate of Comparative Example 1, including silicon alone, and the silicon-containing structure of Comparative Example 2 were used, respectively, instead of the silicon-containing structure of Comparative Example 2.

Comparative Manufacturing Example 6: Manufacture of Negative Electrode and Coin Half Cell A negative electrode and a coin half cell were manufactured in the same manner as in Comparative Manufacturing Example 3, except that a lithium metal was used as a counter electrode, instead of the positive electrode.

Evaluation Example 1: Scanning Electron Microscopy/Transmission Electron Microscopy (SEM/TEM)

Figure 3:
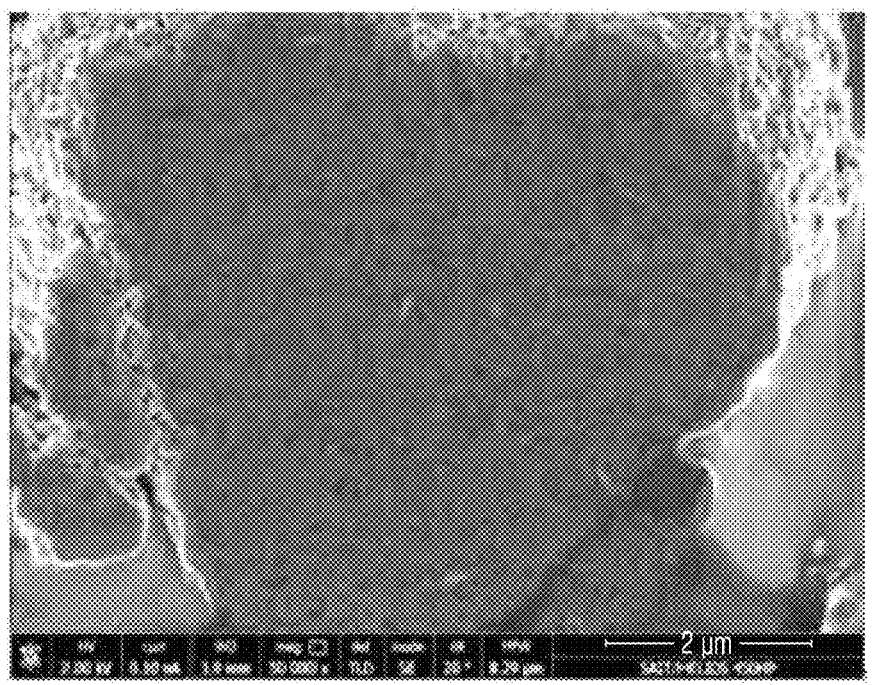
FIGS. 3 and 4 are scanning electron microscope (SEM) images of a silicon-containing structure prepared in accordance with Example 1.
Figure 4:
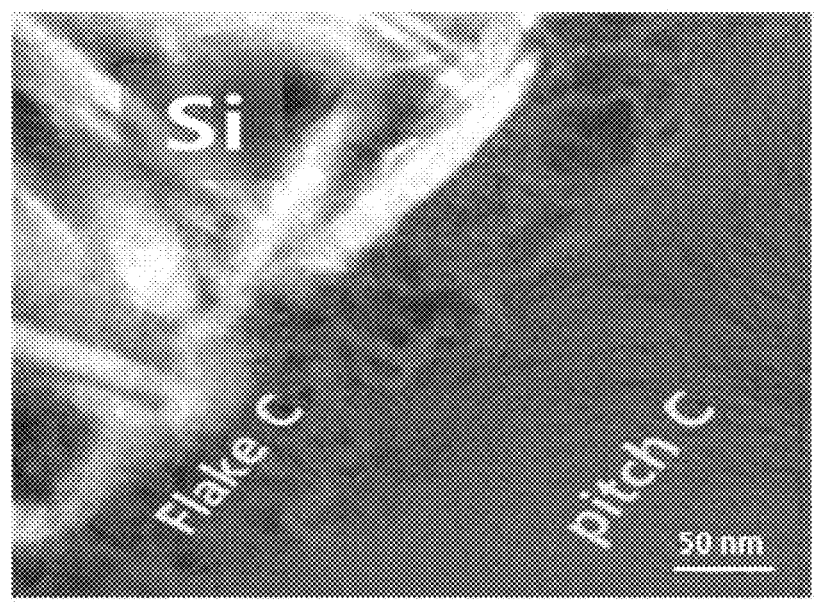
Figure 5:
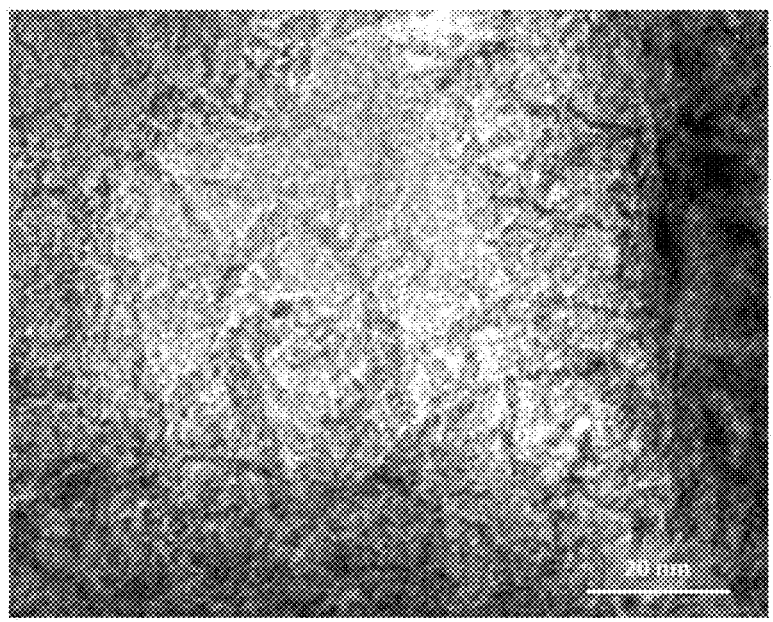
FIGS. 5 and 6 are transmission electron microscope (TEM) images of the silicon-containing structure of Example 1.
Figure 6:
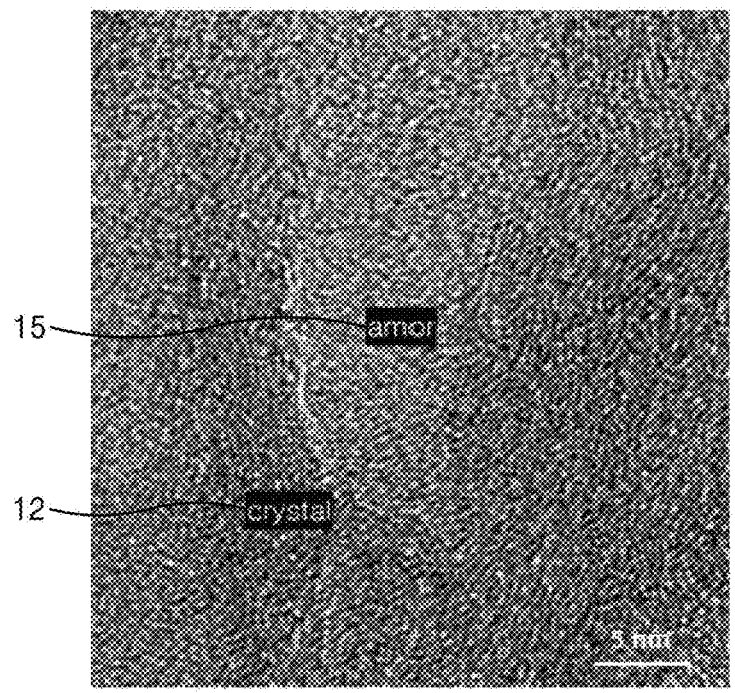

The silicon-containing structure of Example 1 was analyzed by scanning electron microscopy (SEM). The SEM results are shown in FIGS. 3 and 4. The silicon-containing structure of Example 1 was also analyzed by transmission electron microscopy (TEM). The TEM results are shown in FIGS. 5 and 6. The SEM and TEM analyzers were a FE-SEM (Hitachi SU 8030) and a Titan cubed 60-300 (FEI), respectively. For comparison with the result of FIG. 3, a SEM image of the silicon-containing structure of Comparative Example 3 is shown in FIG. 19.

Figure 19:
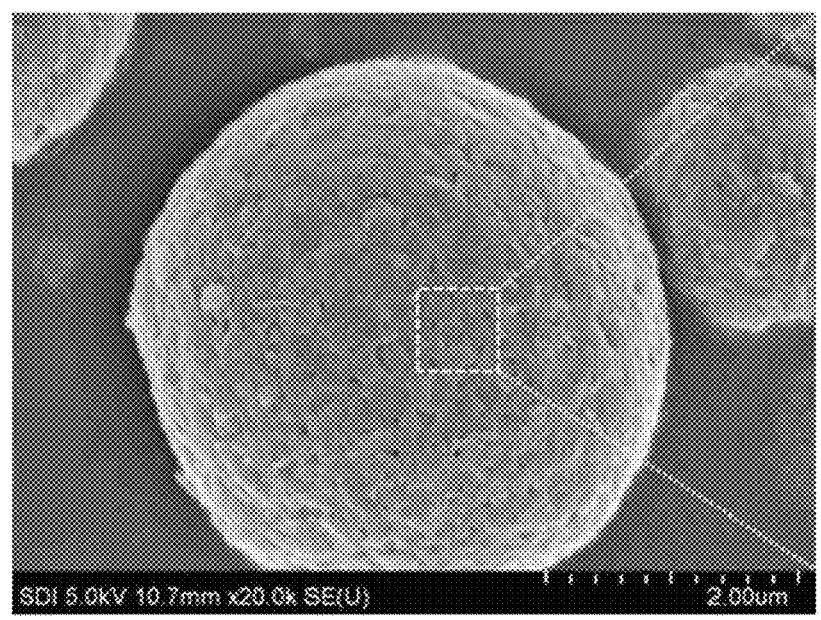
FIG. 19 is a SEM image of a silicon-containing structure prepared in accordance with Comparative Example 3.

The porous silicon composite structure of Comparative Example 3 was found to have a spherical particle shape as shown FIG. 19. In comparison, the porous silicon composite structure of Example 1 was found to have a non-spherical particle shape and a non-porous inner structure, as shown in FIG. 3. The porous silicon composite structure of Example 1 has a structure in which the carbon flakes are directly coated on the silicon/silicon suboxide and the amorphous carbon is directly coated on the carbon flakes and indirectly coated on the silicon/silicon suboxide, as shown in FIG. 4, having a double-carbon composite structure.

Referring to FIG. 5, the silicon-containing structure of Example 1 was found to include the carbon flakes on a surface thereof and the carbonaceous coating layer. Referring to FIG. 6, the carbon flakes 12 were observed to have a lattice pattern and to be crystalline carbon, and the carbonaceous coating layer 15 was found to be amorphous.

Evaluation Example 2: Charge and Discharge Characteristics

1) Manufacturing Example 4 and Comparative Manufacturing Examples 4 and 5

Charge and discharge characteristics of the coin half cells of Manufacturing Example 4 and Comparative Manufacturing Examples 4 and 5 were evaluated under the following conditions: (Charging: 1.0 C/Cutoff: 4.2V-0.01 C, and Discharging: 1.0 C/Cutoff: 2.5V)
Initial efficiency of the evaluated charge and discharge cycle are shown in Table 1.

TABLE 1

| Example | Initial efficiency (%) |
| --- | --- |
| Manufacturing Example 4 | 88.05 |
| Comparative Manufacturing Example 4 | 72.0 |
| Comparative Manufacturing Example 5 | 78.6 |

Referring to Table 1, the coin half cell of Manufacturing Example 4 was found to have improved initial efficiency, lifetime, compared to the coin half cells of Comparative Manufacturing Examples 4 and 5.

2) Manufacturing Example 3 and Comparative Manufacturing Example 3

Figure 10:
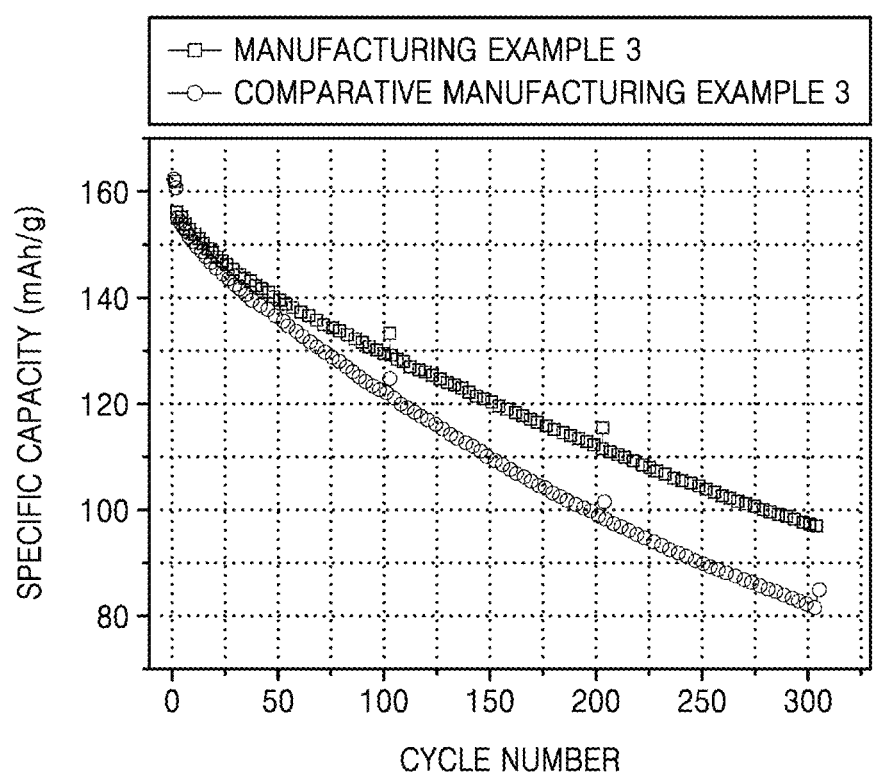
FIG. 10 shows the results of evaluation of charge and discharge characteristics of the coin full cells of Manufacturing Example 3 and a coin full cell of Comparative Manufacturing Example 3.

Charge and discharge characteristics of the coin half cells of Manufacturing Example 3 and Comparative Manufacturing Example 3 were evaluated under the following conditions: (Charging: 1.0 C/Cutoff: 4.2V-0.01 C, Discharging: 1.0 C/Cutoff: 2.5V)
The results of the charge and discharge characteristics evaluation are shown in Table 2. In Table 2, the lifespan is represented by a capacity retention after repetition of 300 cycles. Specific capacity characteristics with respect to the number of cycles are shown in FIG. 10.

TABLE 2

| Example | Lifespan (%) |
| --- | --- |
| Manufacturing Example 3 | 68 |
| Comparative Manufacturing Example 3 | 55 |

Referring to Table 2, the coin full cell of Manufacturing Example 3 was found to have improved lifespan and specific capacity characteristics, compared to the coin full cell of Comparative Manufacturing Example 3.

3) Manufacturing Example 5 and Comparative Manufacturing Example 6

Charge and discharge characteristics of the coin half cells of Manufacturing Example 5 and Comparative Manufacturing Example 6 were evaluated under the following conditions: (Charging: 1.0 C/Cutoff: 4.2V-0.01 C, Discharging: 1.0 C/Cutoff: 2.5V)
The results of the Initial efficiency of the coin half cells of Manufacturing Example 5 and Comparative Manufacturing Example 6 are shown in Table 3. The lifespan is represented by a capacity retention obtained after repetition of 300 cycles. Specific capacity characteristics with respect to the number of cycles are shown in FIG. 10.

TABLE 3

| Example | Initial efficiency (%) |
| --- | --- |
| Manufacturing Example 5 | 91.9 |
| Comparative Manufacturing Example 6 | 90.5 |

Referring to Table 3, the coin half cell of Manufacturing Example 5 was found to have an initial efficiency superior to that of the coin half cell of Comparative Manufacturing Example 6.

Evaluation Example 3: Charge and Discharge Characteristics

Figure 11:
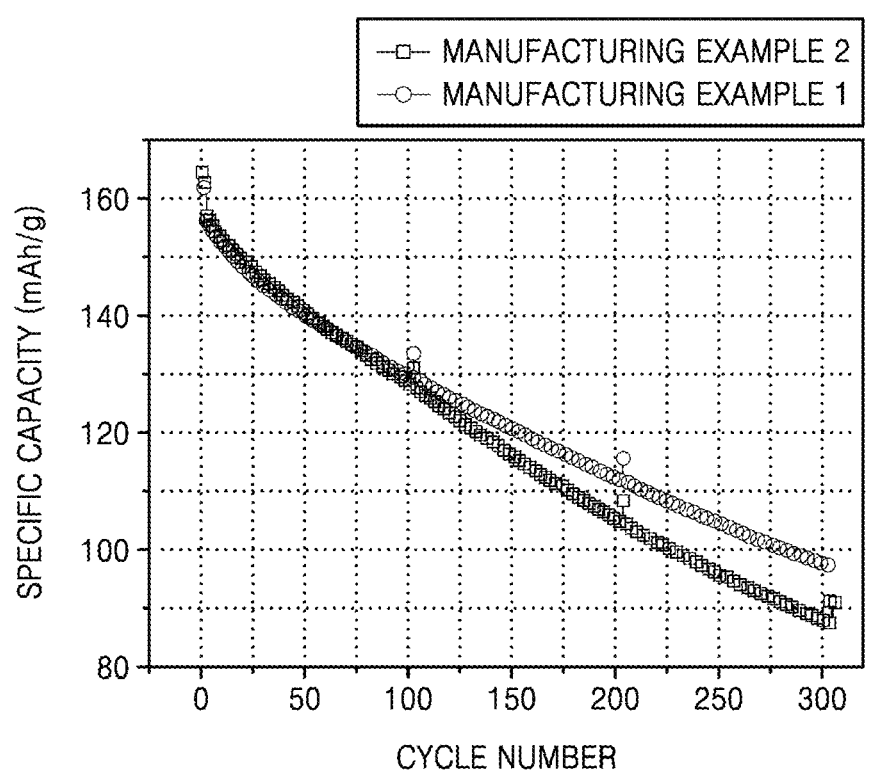
FIG. 11 is a graph of specific capacity (milliampere hours per g, mAh/g) versus cycle number showing the results for the coin full cells of Manufacturing Example 1 and Manufacturing Example 2.
Figure 12:
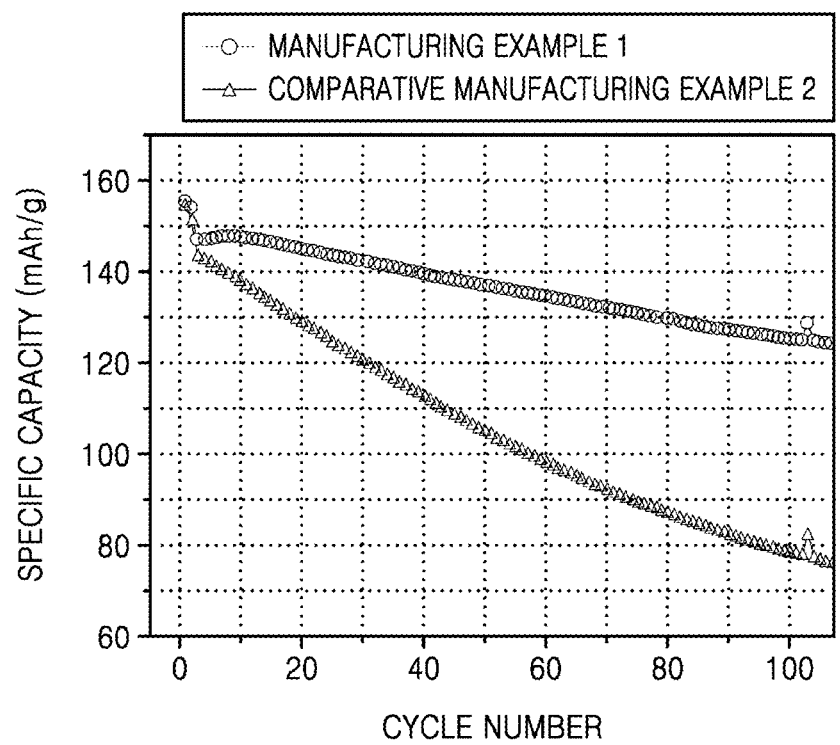
FIG. 12 is a graph of specific capacity (mAh/g) versus cycle number showing the results for the coin full cells of Manufacturing Example 1 and Comparative Manufacturing Example 2.
Figure 13:
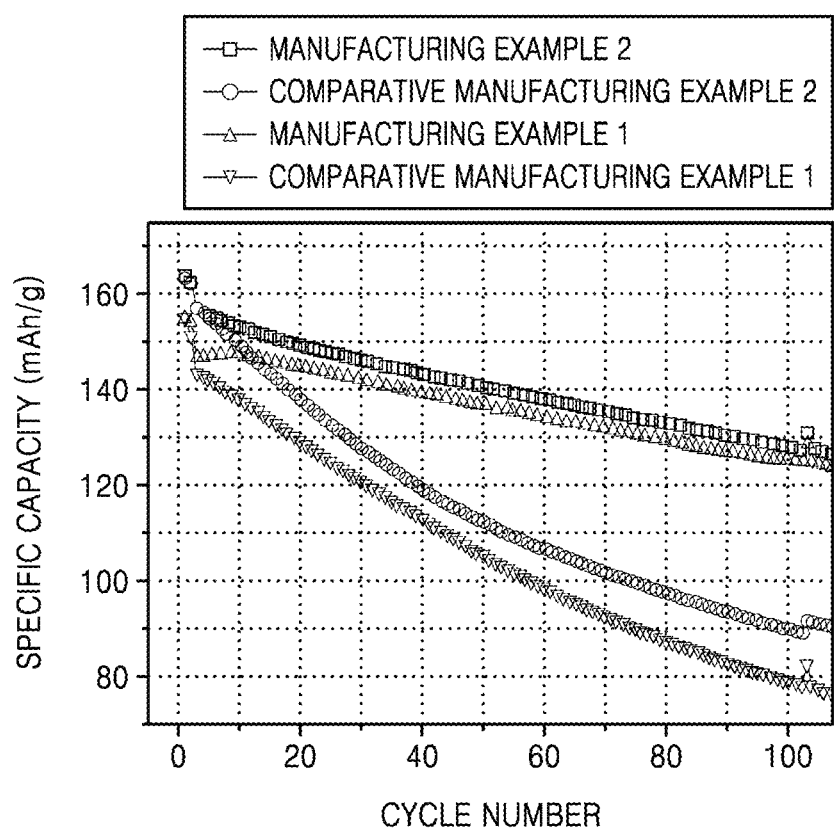
FIG. 13 is a graph of specific capacity (mAh/g) versus cycle number showing the results for the coin full cells of Manufacturing Example 1, Manufacturing Example 2, Comparative Manufacturing Example 1, and Comparative Manufacturing Example 2.

Charge and discharge characteristics of the coin full cells of Manufacturing Examples 1 and 2 and Comparative Manufacturing Examples 1 and 2 were evaluated under the following conditions: (Charging: 1.0 C/Cutoff: 4.2V-0.01 C, Discharging: 1.0 C/Cutoff: 2.5V)
The results of the charge and discharge characteristics evaluation are shown in FIGS. 11 to 13. FIG. 11 shows the changes in specific capacity with respect to the number of cycles in the coin full cells of Manufacturing Example 1 and Manufacturing Example 2. FIG. 12 shows the changes in specific capacity with respect to the number of cycles in the coin full cells of Manufacturing Example 1, Manufacturing Example 2, and Comparative Manufacturing Example 2. FIG. 13 shows the changes in specific capacity with respect to the number of cycles in the coin full cells of Manufacturing Example 1, Manufacturing Example 2, Comparative Manufacturing Example 1, and Comparative Manufacturing Example 2.
Referring to FIGS. 11 to 13, the coin full cells of Manufacturing Examples 1 and 2 were found to have improved lifespan and specific capacity characteristics, compared to the coin full cells of Comparative Manufacturing Examples 1 and 2.

Evaluation Example 4: Expansion Ratio

The coin full cells of Manufacturing Example 1 and Comparative Manufacturing Example 1 were each charged under a constant current/constant voltage (CC/CV) condition, and in particular, at a constant current (CC) of about 0.1 C until the voltage reached about 4.2 V, and then at a constant voltage (CV) until the current reached 0.005 C. After being left for about 20 minutes, each of the coin full cells was discharged at a constant current of 0.1 C until the voltage reached 1.5 V, thereby completing a $1^{st}$ charge-discharge cycle. After being left for about 20 minutes, each of the coin full cells was fully charged at 0.2 C, and then disassembled to measure an electrode expansion ratio as measured by the difference in electrode thickness between before and after the charging and discharging. The measurement results are shown in Table 4.

TABLE 4

| Example | Electrode expansion ratio (%) |
| --- | --- |
| Manufacturing Example 1 | 17.8 |
| Comparative Manufacturing Example 1 | 50.0 |

Referring to Table 4, the coin full cell of Manufacturing Example 1 was found to have a reduced electrode expansion ratio, compared to the coin full cell of Comparative Manufacturing Example 1.

Evaluation Example 5: Cross-Section Analysis after Charging and Discharging

Charge and discharge characteristics of the coin full cells of Manufacturing Example 3 and Comparative Manufacturing Example 3 were evaluated under the following conditions: (Charge: 25° C., 1.0 C/Cutoff: 4.2V-0.01 C, Discharge: 1.0 C/Cutoff: 2.5V). The charging and discharging cycle was repeated 100 times in total.

Figure 7:
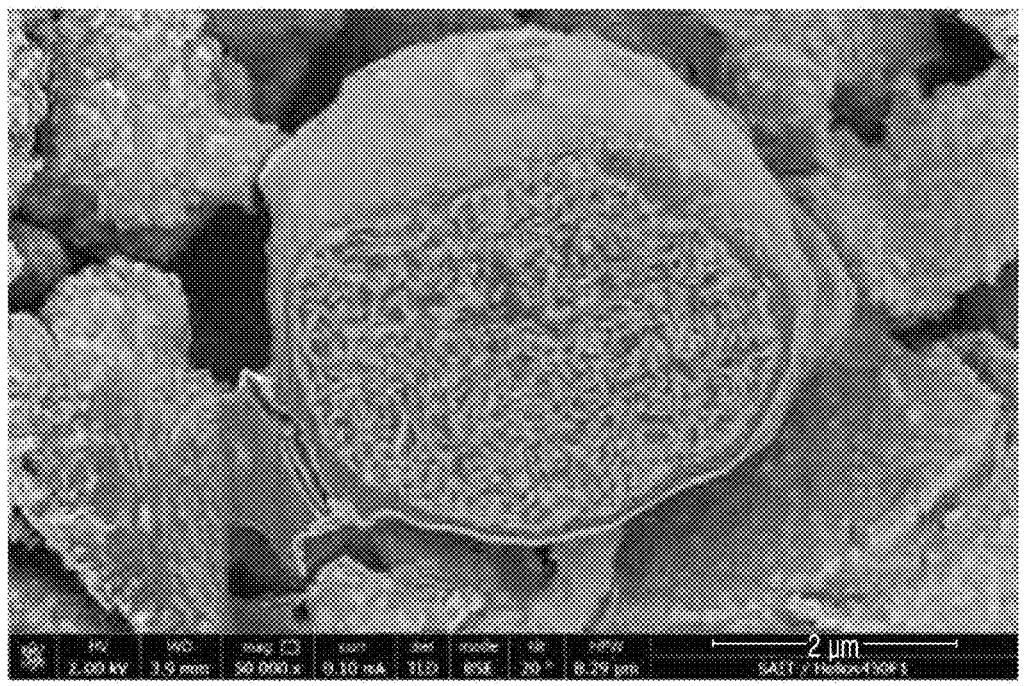
FIGS. 7 to 8 show the results of scanning electron microscopy/energy dispersive spectroscopy (SEM/EDS) of a cross-section surface of a negative active material from the coin full cell battery of Manufacturing Example 3, after charging and discharging.
Figure 8:
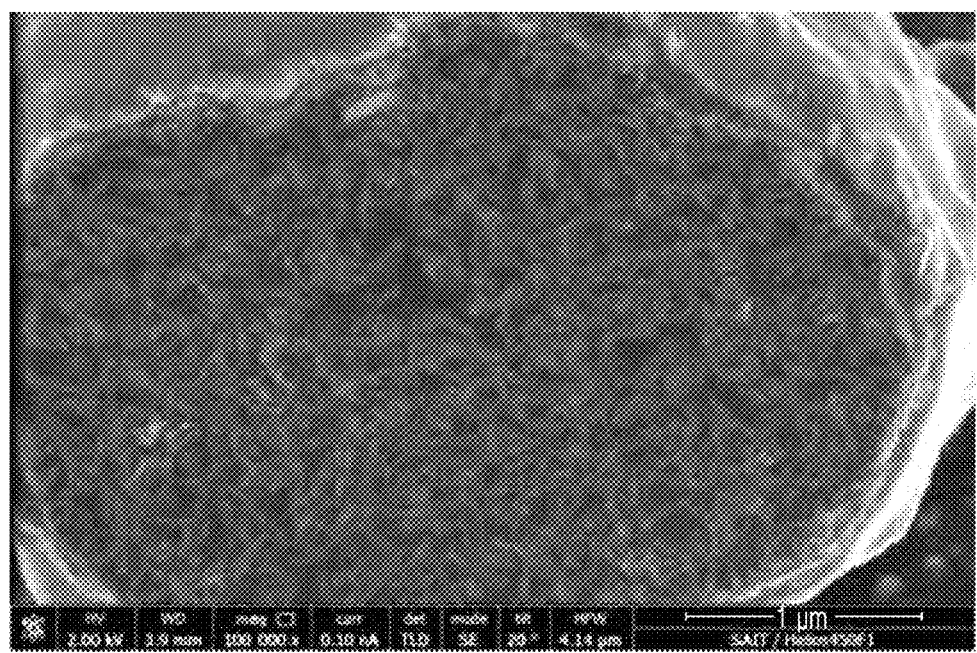

After the $100^{th}$ cycle of charging and discharging, each coin full cell was disassembled and then a cross-section surface of the negative active material of the negative electrode was observed using scanning electron microscopy/ energy dispersive spectroscopy (SEM/EDS). The analysis results are shown in FIGS. 7 to 9.

Figure 9:
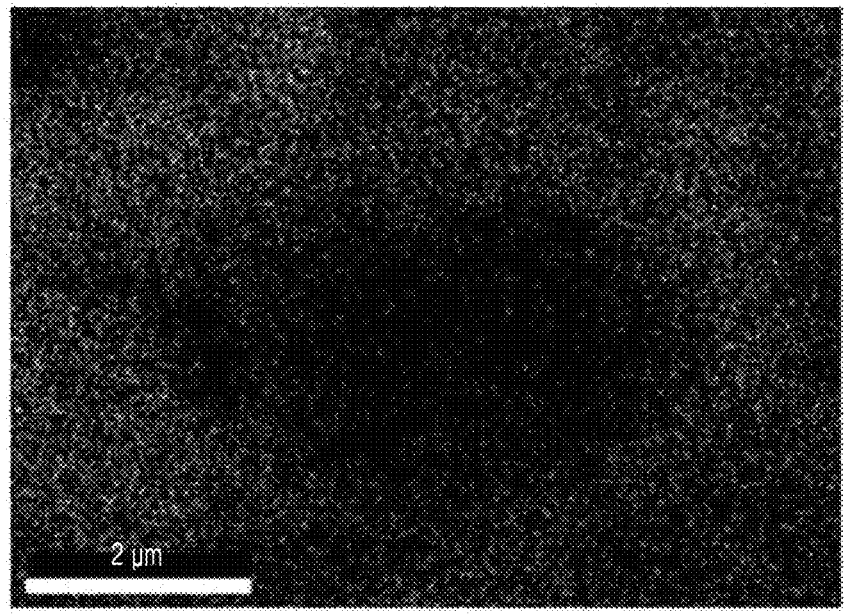
FIG. 9 shows the results of fluorine mapping by energy dispersive spectroscopy (EDS) of a cross-section surface of a negative active material from a coin full cell of Manufacturing Example 3, after charging and discharging.

According to the fluorine ion mapping results by EDS as shown in FIG. 9, as carbon was filled in the negative active material of Manufacturing Example 3, essentially no infiltration of fluorine ions from the liquid electrolyte into the negative electrode occurred after the repeated charging and discharging cycles, indicating that the negative active material of Manufacturing Example 3 has a reduced tendency to allow infiltration of the liquid electrolyte over repeated charging and discharging cycles. This result also indicates that the silicon-containing structure used in Manufacturing Example 3 may have improved chemical structural stability. In comparison, in the coin full cell of Comparative Manufacturing Example 3, fluorine ions were uniformly distributed in the silicon-containing structure after the charging and discharging cycles, indicating that the liquid electrolyte widely infiltrated into the negative active material. It was also observed that deterioration of silicon occurred, due to a side reaction with the liquid electrolyte and the negative active material, and as a result, pores of the negative active material were filled with liquid electrolyte after the repeated charging and discharging cycles. It was also observed that the liquid electrolyte infiltrated into the pores at an early stage and that a SEI was rapidly formed in the secondary particles due to the side reaction with silicon. Accordingly, the coin full cell of Comparative Manufacturing Example 3 was found to have reduced lifespan characteristics and an increased expansion ratio.

As described above, according to the one or more embodiments, when used as an electrode active material, a silicon-containing structure may form a network between silicon particles to thus suppress expansion of the electrode during charging and discharging, and may also improve initial efficiency and volume energy density of the lithium battery. The silicon-containing structure may also form a conductive, durable protective layer for silicon, and thus may improve durability of the lithium battery during charging and discharging.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A silicon-containing structure comprising:
a silicon composite comprising
a porous silicon secondary particle, and
a first carbon flake on a surface of the porous silicon secondary particle;
a carbonaceous coating layer on the silicon composite, the carbonaceous coating layer comprising a first amorphous carbon; and
the silicon composite comprises a second amorphous carbon and has a density that is equal to or less than a density of the carbonaceous coating layer,
wherein the porous silicon secondary particle comprises an aggregate of silicon composite primary particles, each comprising
silicon,
a silicon suboxide on a surface of the silicon, and
a second carbon flake on a surface of the silicon suboxide, and
wherein pores in the porous silicon secondary particle are filled with the second amorphous carbon.

2. The silicon-containing structure of claim 1, wherein the silicon suboxide is a film, a matrix, or a combination thereof, and
the first carbon flake and the second carbon flake are each independently a film, a particle, a matrix, or a combination thereof.

3. The silicon-containing structure of claim 1, wherein the second amorphous carbon is disposed in a pore of the porous silicon secondary particle.

4. The silicon-containing structure of claim 1, wherein the silicon composite has a porosity of greater than 0 to about 60 percent or less.

5. The silicon-containing structure of claim 1, wherein the first carbon flake and the second carbon flake are a same carbon flake.

6. The silicon-containing structure of claim 1, wherein a ratio of a total weight of the first carbon flake and the second carbon flake to a total weight of the first amorphous carbon and the second amorphous carbon is about 1:99 to 99:1.

7. The silicon-containing structure of claim 1, wherein a ratio of a total weight of the first carbon flake and the second carbon flake to a total weight of the first amorphous carbon and the second amorphous carbon is about 1:1 to about 1:10.

8. The silicon-containing structure of claim 1, wherein the silicon-containing structure has a non-spherical shape.

9. The silicon-containing structure of claim 1, wherein the first carbon flake and the second carbon flake each independently comprise graphene, graphite, carbon fiber, graphitic carbon, graphene oxide, or a combination thereof.

10. The silicon-containing structure of claim 1, wherein the first amorphous carbon and the second amorphous carbon each independently comprise pitch carbon, soft carbon, hard carbon, a meso-phase pitch carbide, a sintered coke, carbon fiber, or a combination thereof.

11. The silicon-containing structure of claim 1, wherein the carbonaceous coating layer further comprises a crystalline carbon.

12. The silicon-containing structure of claim 11, wherein the crystalline carbon comprises natural graphite, artificial graphite, graphene, fullerene, carbon nanotubes, or a combination thereof.

13. The silicon-containing structure of claim 1, wherein the carbonaceous coating layer comprises a first carbonaceous coating layer comprising amorphous carbon, and a second carbonaceous coating layer comprising crystalline carbon.

14. The silicon-containing structure of claim 1, wherein the carbonaceous coating layer is a non-porous continuous coating layer having a thickness of about 1 nanometer to about 5,000 nanometers.

15. The silicon-containing structure of claim 1, wherein a total amount of the first carbon flake and the second carbon flake in the silicon-containing structure is about 0.1 parts by weight to about 2,000 parts by weight, based on 100 parts by weight of the silicon in the silicon composite structure.

16. The silicon-containing structure of claim 1, wherein the first carbon flake of the porous silicon secondary particle is a first graphene flake, the first graphene flake comprises about 1 to about 30 graphene layers, and
a total thickness of the first graphene flake is about 0.3 nanometers to about 50 nanometers.

17. The silicon-containing structure of claim 16, wherein the first graphene flake is oriented at an angle of about 0° to about 90° with respect to a major axis of the silicon, and the first graphene flake is spaced apart from the silicon suboxide by a distance of about 1,000 nm or less.

18. The silicon-containing structure of claim 1, wherein the second carbon flake of the silicon composite primary particle is a second graphene flake, which comprises about 1 to about 30 graphene layers, and
a total thickness of the second carbon flake is about 0.3 nanometers to about 50 nanometers.

19. The silicon-containing structure of claim 1, wherein the second carbon flake is oriented at an angle of about 0° to about 90° with respect to a major axis of the silicon, and the second graphene flake is spaced apart from the silicon suboxide by a distance of about 10 nm or less.

20. The silicon-containing structure of claim 1, wherein the silicon suboxide has a thickness of about 30 micrometers or less.

21. The silicon-containing structure of claim 1, wherein a shape of the silicon comprises a sphere, a nanowire, a needle, a rod, a particle, a nanotube, a nanorod, a wafer, a nanoribbon, or a combination thereof.

22. The silicon-containing structure of claim 1, wherein the porous silicon secondary particle has an average particle diameter of about 200 nanometers to about 50 micrometers, a specific surface area of about 0.1 square meters per gram to about 100 square meters per gram, and a density of about 0.1 grams per cubic centimeter to about 2.8 grams per cubic centimeter.

23. The silicon-containing structure of claim 1, wherein the silicon comprises particles having an average size of about 10 nanometers to about 30 micrometers.

24. The silicon-containing structure of claim 1, wherein the silicon composite has a D50 particle size of about 1 micrometer to about 30 micrometers, a D10 particle size of about 0.001 micrometer to about 10 micrometers, and a D90 particle size of about 10 micrometers to about 60 micrometers.

25. A method of preparing the silicon-containing structure of claim 1, the method comprising:
providing the porous silicon secondary particle;
supplying a gas comprising a carbon source to the porous silicon secondary particle and thermally treating the porous silicon secondary particle to prepare the silicon composite;
combining the silicon composite, the first amorphous carbon, and an additive;
forming the carbonaceous coating layer comprising the first amorphous carbon on a surface of the silicon composite; and
disposing the second amorphous carbon in pores of the porous silicon secondary particle to form the silicon-containing structure.

26. The method of claim 25, wherein the providing of the porous silicon secondary particle comprises preparing a composition comprising a dispersing agent, a first solvent, and particles comprising silicon and silicon suboxide on a surface of the silicon.

27. The method of claim 25, wherein an amount of the first amorphous carbon in the composition obtained by combining the silicon composite, the first amorphous carbon, and an additive is about 3 parts by weight to about 60 parts by weight with respect to 100 parts by weight of the silicon composite.

28. The method of claim 25, wherein the combining of the silicon composite, the first amorphous carbon, and the additive is performed using a revolution and rotation centrifugal mixer.

29. The method of claim 25, wherein the combining of the silicon composite, the first amorphous carbon, and the additive is performed at an agitation speed of about 2,000 rotations per minute or less and at a temperature of about 100° C. or less.

30. The method of claim 25, wherein the additive comprises N-methylpyrrolidone, isopropyl alcohol, dimethylformamide, butanol, acetone, or a combination thereof.

31. A carbon composite comprising,
the silicon-containing structure of claim 1, and
a carbonaceous material.

32. The carbon composite of claim 31, wherein the carbonaceous material comprises graphene, graphite, fullerene, graphitic carbon, carbon fiber, carbon nanotubes, or a combination thereof, and an amount of the carbonaceous material is about 0.001 part by weight to about 99 parts by weight with respect to 100 parts by weight of the carbon composite.

33. An electrode comprising, the silicon-containing structure of claim 1, a carbon composite comprising the silicon-containing structure and a carbonaceous material, or a combination thereof.

34. The electrode of claim 33, wherein the electrode comprises the carbon composite comprising the silicon-containing structure and the carbonaceous material, and the carbonaceous material comprises graphene, graphite, fullerene, carbon fiber, graphitic carbon, carbon nanotubes, or a combination thereof, and an amount of the carbonaceous material is about 0.001 part by weight to about 99 parts by weight with respect to 100 parts by weight of the carbon composite.

35. A lithium battery comprising the electrode of claim 33.

36. A device comprising, the silicon-containing structure of claim 1, a carbon composite comprising the silicon-containing structure and a carbonaceous material, or a combination thereof.

37. The device of claim 36, wherein the device is a field emission device, a biosensor, a semiconductor device, or a thermoelectric device.

38. A silicon-containing structure comprising:
a silicon composite comprising,
a porous silicon secondary particle, and
a first carbon flake on a surface of the porous silicon secondary particle;
a carbonaceous coating layer on the silicon composite, the carbonaceous coating layer comprising a first amorphous carbon; and
the silicon composite comprises a second amorphous carbon and has a density that is equal to or less than a density of the carbonaceous coating layer,
wherein the porous silicon secondary particle comprises an aggregate of silicon composite primary particles, each comprising, silicon,
a silicon-containing layer on a surface of the silicon, and
a second carbon flake on a surface of the silicon-containing layer,
wherein the silicon-containing layer comprises a silicon suboxide, a thermal treatment product of the silicon suboxide, or a combination thereof,
wherein the silicon-containing layer is a film, a matrix, or a combination thereof,
wherein the first carbon flake and the second carbon flake are each independently a film, a particle, a matrix, or a combination thereof, and
wherein a ratio of a total weight of the first carbon flake and the second carbon flake to a total weight of the first amorphous carbon and the second amorphous carbon is about 1:1 to about 1.10.

39. The silicon-containing structure of claim 38 wherein the thermal treatment product of the silicon suboxide is a product obtained by thermally treating the silicon suboxide in an atmosphere comprising a carbon source gas or a combination of a carbon source gas and a reducing gas.

40. The silicon-containing structure of claim 38, wherein the thermal treatment product of the silicon suboxide comprises silicon in a $SiO_y$ matrix, wherein $0 \leq y \leq 2$.

41. The silicon-containing structure of claim 38, wherein the thermal treatment product of the silicon suboxide comprises:
a structure comprising silicon in a $SiO_2$ matrix,
a structure comprising silicon in a matrix comprising $SiO_2$ and $SiO_x$, wherein $0<x<2$, or
a structure including silicon in a $SiO_x$, wherein $0<x<2$, matrix.

42. A silicon-containing structure comprising:
a silicon composite comprising
a porous silicon secondary particle, and
a first carbon flake on a surface of the porous silicon secondary particle;
a carbonaceous coating layer on the silicon composite, the carbonaceous coating layer comprising a first amorphous carbon; and
the silicon composite comprises a second amorphous carbon and has a density that is equal to or less than a density of the carbonaceous coating layer,
wherein the porous silicon secondary particle comprises an aggregate of silicon composite primary particles, each comprising
silicon,
a silicon suboxide on a surface of the silicon, and
a second carbon flake on a surface of the silicon suboxide, and
wherein a ratio of a total weight of the first carbon flake and the second carbon flake to a total weight of the first amorphous carbon and the second amorphous carbon is about 1:1 to about 1:10.

* * * * *